United States Patent
Maruyama et al.

(10) Patent No.: US 8,495,549 B2
(45) Date of Patent: Jul. 23, 2013

(54) METHOD FOR GENERATING WIRING PATTERN DATA

(75) Inventors: Takashi Maruyama, Koto (JP); Shinji Sugatani, Hachiohji (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 13/483,844

(22) Filed: May 30, 2012

(65) Prior Publication Data

US 2013/0019220 A1    Jan. 17, 2013

(30) Foreign Application Priority Data

Jul. 15, 2011    (JP) .................. 2011-156205

(51) Int. Cl.
*G06F 17/50*    (2006.01)
(52) U.S. Cl.
USPC .............. 716/126; 716/52; 716/55; 716/129; 716/130
(58) Field of Classification Search
USPC ................. 716/50–56, 126–131; 430/5, 30
See application file for complete search history.

(56) References Cited

U.S. PATENT DOCUMENTS

| | | | |
|---|---|---|---|
| 6,225,025 B1* | 5/2001 | Hoshino | 430/296 |
| 2001/0028984 A1* | 10/2001 | Yamashita et al. | 430/5 |
| 2001/0028991 A1 | 10/2001 | Inanami et al. | |
| 2003/0003375 A1 | 1/2003 | Takita et al. | |
| 2004/0149935 A1* | 8/2004 | Nakasugi | 250/492.22 |
| 2006/0063078 A1* | 3/2006 | Nakasugi | 430/30 |
| 2011/0192994 A1* | 8/2011 | Lanpanik et al. | 250/492.22 |
| 2012/0264062 A1* | 10/2012 | Shin et al. | 430/296 |

FOREIGN PATENT DOCUMENTS

| | | |
|---|---|---|
| JP | 2003-17388 A | 1/2003 |
| JP | 3886695 B2 | 12/2006 |
| JP | 2007-129265 A | 5/2007 |

* cited by examiner

*Primary Examiner* — Nha Nguyen
(74) *Attorney, Agent, or Firm* — Arent Fox LLP

(57) ABSTRACT

A method includes connecting in a wiring area a plurality of basic block patterns which include a plurality of track patterns extending to one direction and being disposed at a prescribed pitch in an intersection direction intersecting the one direction to generate a plurality of parallel wiring patterns, each of which includes the track patterns connected together; generating a wiring route running on a track pattern; cutting away a track pattern terminal end, on which no wiring route runs, out of track pattern terminal ends of a track pattern including a route end of the wiring route and an adjacent track pattern connected to a track pattern start end of the track pattern concerned; and generating a wiring pattern data including a block pattern identifier corresponding to a basic block pattern out of the basic block patterns in the wiring area and a layout position of the basic block pattern.

10 Claims, 34 Drawing Sheets

86

68a
82
64
64
64
64
64

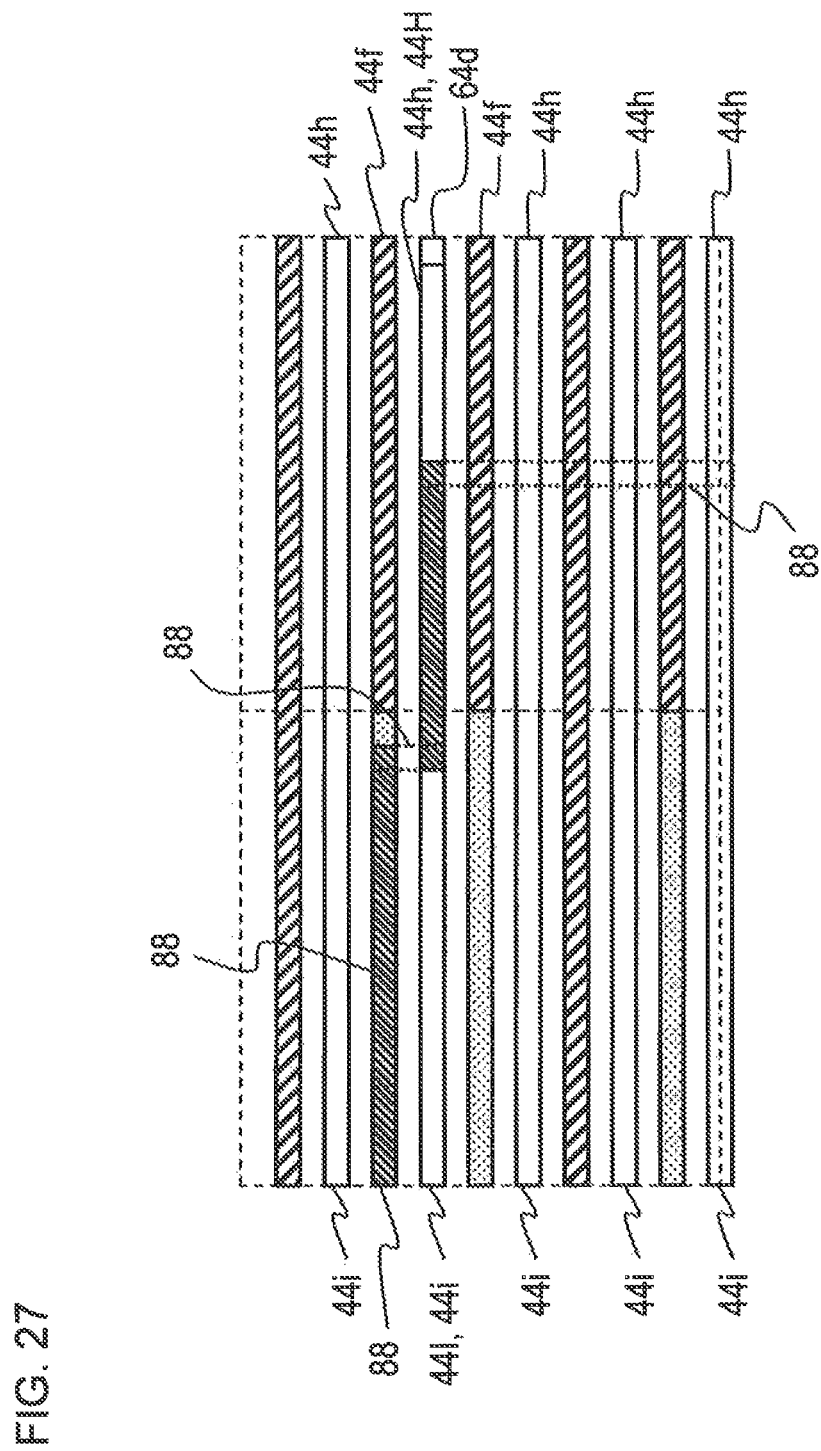

METHOD FOR GENERATING WIRING PATTERN DATA

CROSS-REFERENCE TO RELATED APPLICATIONS

This application is based upon and claims the benefit of priority of the prior Japanese Patent Application No. 2011-56205, filed on Jul. 15, 2011, the entire contents of which are incorporated herein by reference.

FIELD

The embodiments discussed herein are related to a method for generating a wiring pattern data.

BACKGROUND

In the manufacturing process of a semiconductor integrated circuit (IC), a desired pattern (shape) is transferred to a resist film by exposing the resist film formed on a semiconductor substrate.

One method for exposing the resist film is an electron beam exposure method. As the electron beam exposure method, variable shaped beam (hereafter referred to as VSB) lithography is well known, in which patterns are transferred one by one by variable shaped beams. However, the VSB method has a problem of low throughput because of a large number of exposure times.

To solve the above problem, a character projection (hereafter referred to as CP) method has been developed. In the CP method, the aperture shape of a block mask (hereafter referred to as block mask pattern) is transferred to the resist film by irradiating the resist film with an electron beam through the block mask. Thus, the throughput is improved because patterns in a prescribed area (for example, a rectangular area having each side of 1 μm) are formed collectively at one-time electron beam exposure.

SUMMARY

According to an aspect of the invention, a method for generating a wiring pattern data includes connecting in a wiring area a plurality of basic block patterns which include a plurality of track patterns extending to one direction and being disposed at a prescribed pitch in an intersection direction intersecting the one direction to generate a plurality of parallel wiring patterns, each of which includes the track patterns connected together; generating a wiring route running on a track pattern in a manner not to dispose route ends of different wiring routes on an identical track pattern; cutting away a track pattern terminal end, on which no wiring route runs, out of track pattern terminal ends of a track pattern including a route end of the wiring route and an adjacent track pattern connected to a track pattern start end of the track pattern concerned; and after the cutting away of a track pattern terminal end, generating a wiring pattern data including a block pattern identifier corresponding to a basic block pattern out of the basic block patterns in the wiring area and a layout position of the basic block pattern, wherein the block pattern identifier corresponds to one of a plurality of cut-away block patterns, which are different from each other, each of which is generated by cutting away a track pattern terminal end of a track pattern included in one of the basic block patterns and one of the basic block patterns, of which track pattern terminal ends are not cut off.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 27 is a pattern diagram explaining the track expansion & bypass route search step;

DESCRIPTION OF EMBODIMENTS

An IC layout pattern includes a cell pattern, such as a gate circuit and a memory cell, and a wiring pattern (the overall shapes of a plurality of wirings) to connect cell patterns. It is easy to extract a common pattern from a plurality of different cell patterns, and therefore, using the pattern extracted from the cell pattern as a block mask pattern, the throughput for the cell pattern is increased.

On the other hand, the wiring patterns have a variety of shapes, and it is difficult to extract a common pattern from the plurality of wiring patterns. For this reason, the VSB method is used for the electron beam exposure of wiring patterns.

Accordingly, in the electron beam exposure method, there is a problem of low throughput for the wiring patterns.

However according to the present embodiments, the throughput of the electron beam exposure for the wiring pattern is increased.

Embodiment 1

Figure 1:
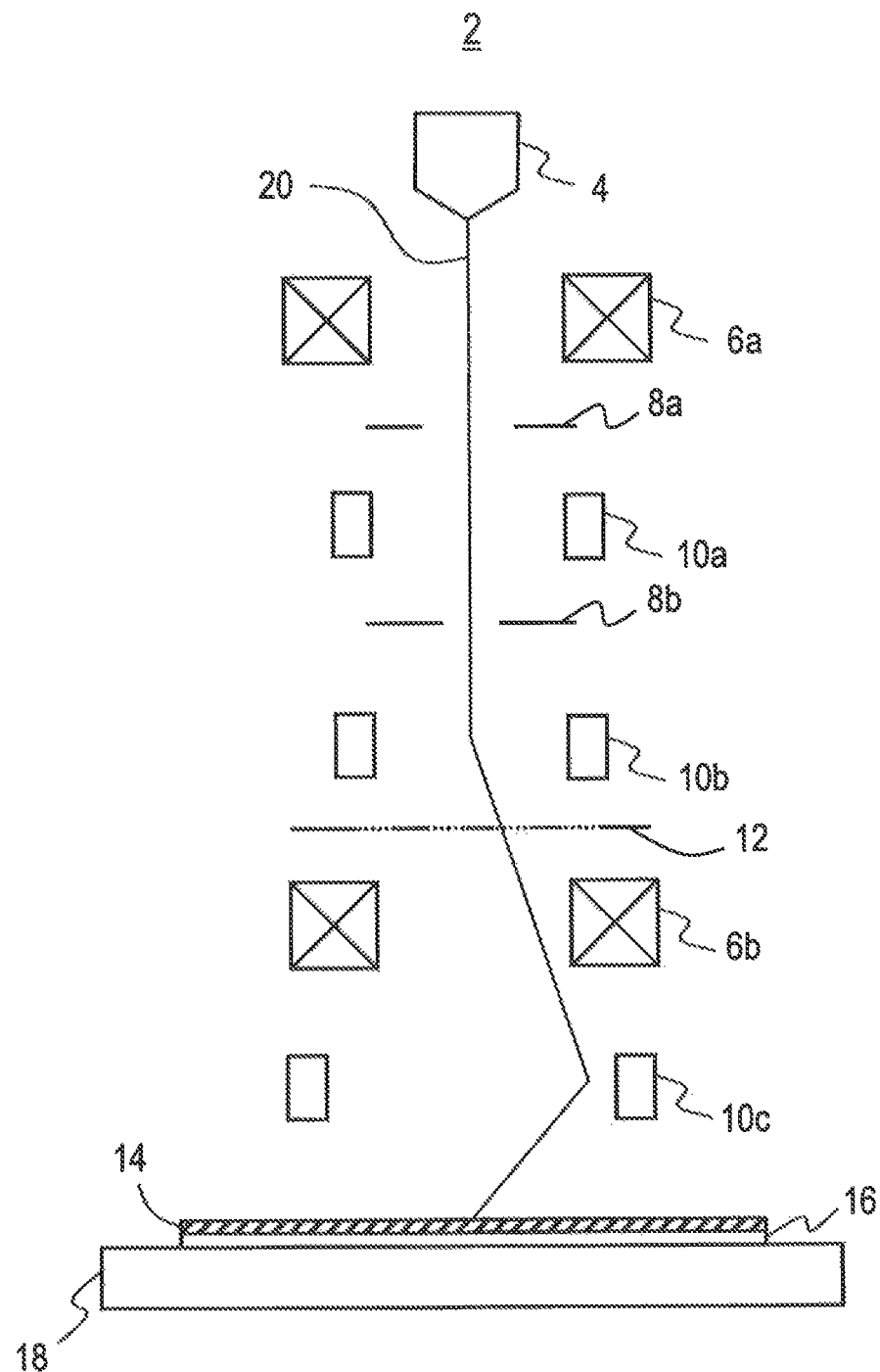
FIG. 1 illustrates a configuration diagram of an electron beam exposure apparatus for rendering a wiring pattern on a resist film, based on a wiring pattern data generated according to the present embodiment.

FIG. 1 illustrates a configuration diagram of an electron beam exposure apparatus 2 for rendering a wiring pattern (an overall shape of a plurality of wirings) on a resist film 14, based on a wiring pattern data generated according to the present embodiment.

As illustrated in FIG. 1, the electron beam exposure apparatus 2 according to the present embodiment includes electron gun 4, collimating magnetic lens 6a, first aperture 8a, first deflector 10a, second aperture 8b and second deflector 10b. The aperture shapes of the first aperture 8a and the second aperture 8b are rectangular.

Further, the electron beam exposure apparatus 2 includes block mask 12, focusing magnetic lens 6b, third deflector 10c and movable stage 18. On the movable stage 18, a semiconductor substrate 16 with the resist film 14 formed thereon is mounted.

An electron beam 20 radiated from the electron gun 4 is converted into a parallel beam by the collimating magnetic lens 6a. The electron beam 20 converted into the parallel beam is shaped into a rectangular beam having approximately the same size as a block mask pattern, by the first aperture 8a, the first deflector 10a and the second aperture 8b. Each side of the rectangular beam has a length of 1.0-1.5 µm, for example.

Thereafter, the electron beam 20 is irradiated to a block (an area in which an aperture having a prescribed shape is provided) provided on the block mask 12, by the second deflector 10b. The electron beam 20 transmitting through the block mask 12 is imaged on a prescribed area of the resist film 14, by the focusing magnetic lens 6b and the third deflector 10c. By this, the block mask pattern is transferred to the resist film 14.

By the repetition of the above exposure process, most portions of the IC layout pattern are transferred to the resist film 14. Portions that may not be formed by the block mask pattern transfer are rendered by the VSB method.

The exposure process performed by means of the electron beam exposure apparatus 2 is controlled by an exposure control device (not illustrated). The control of the exposure process is carried out based on an exposure data recorded on a recording medium (not illustrated). The exposure data is generated based on an IC layout data. The IC layout data includes a wiring pattern data and a connection via data generated according to the present embodiment.

The resist film 14 is a positive-type resist, as an example. The wiring pattern to be transferred on a positive-type resist film is suitable for wiring formation by a damascene method. On the other hand, a wiring pattern to be transferred on a negative-type resist film is suitable for wiring formation by a non-damascene method. Therefore, in the wiring formation by the non-damascene method, the negative-type resist film is used as the resist film 14.

Figure 2:
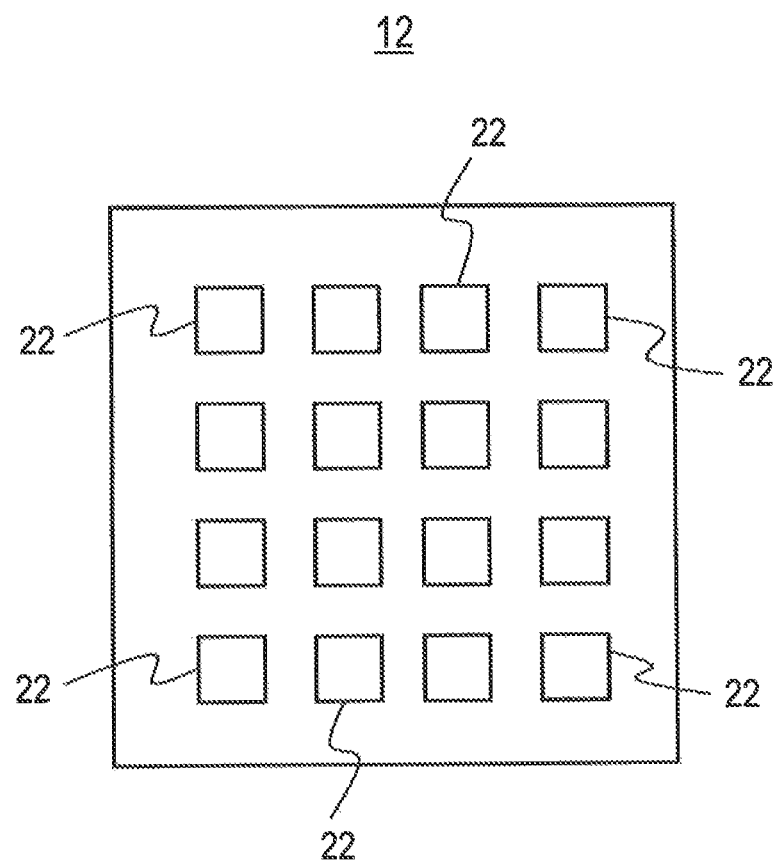
FIG. 2 is a plan view of the block mask.
Figure 3:
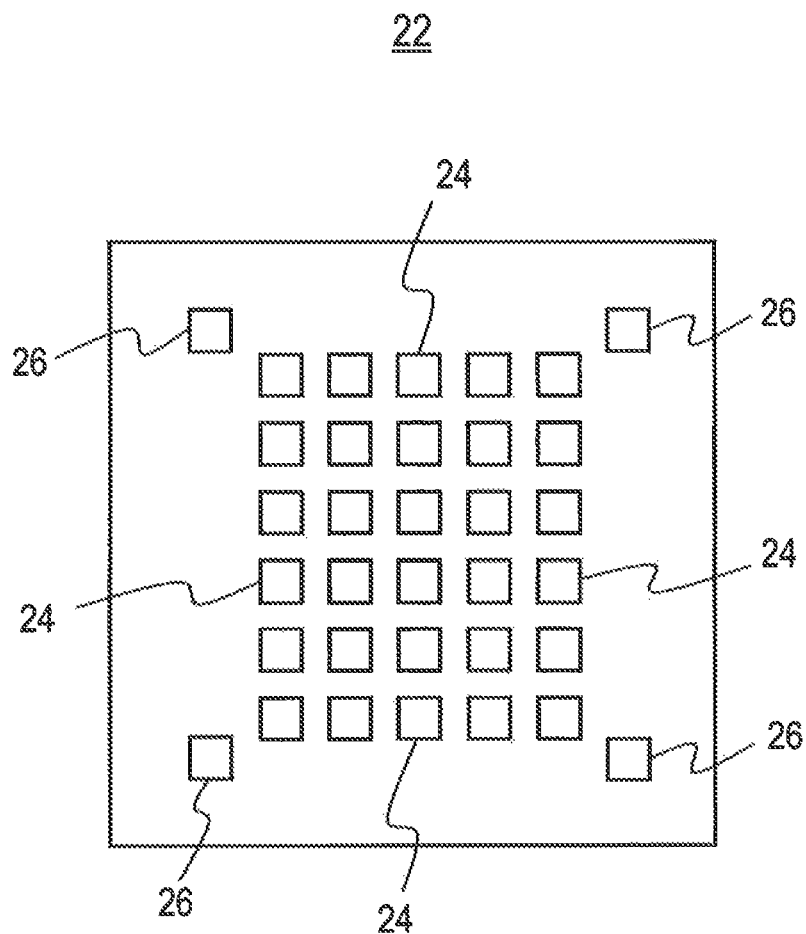
FIG. 3 is a plan view of each block area.

FIG. 2 is a plan view of the block mask 12. The planer shape of the block mask 12 is a square having one side of around 5 cm, for example. As illustrated in FIG. 2, a plurality of block areas 22 are provided in the block mask 12. FIG. 3 is a plan view of each block area 22.

The block area 22 is, for example, a rectangular area having a diagonal of around 4.4 mm. As illustrated in FIG. 3, a plurality of blocks 24 are provided in the central portion of the block area 22. Each block 24 is a rectangular area having one side of around 1.0 µm (around 1.0 µm×1.0 µm area), for example. On the block 24, an aperture corresponding to an exposure pattern is provided.

In each block area 22, for each layer (for example, gate layer, wiring layer and via layer) provided in the IC layout pattern, a block for use in rendering each layer is provided. In each block area 22, appropriately 4000 blocks 24 are provided, for example. Rectangular slits 26 are provided at four corners of the block area 22. The rectangular slits are used for positioning of exposure positions, and for generating a variable rectangular pattern of the VSB method.

Figure 4:
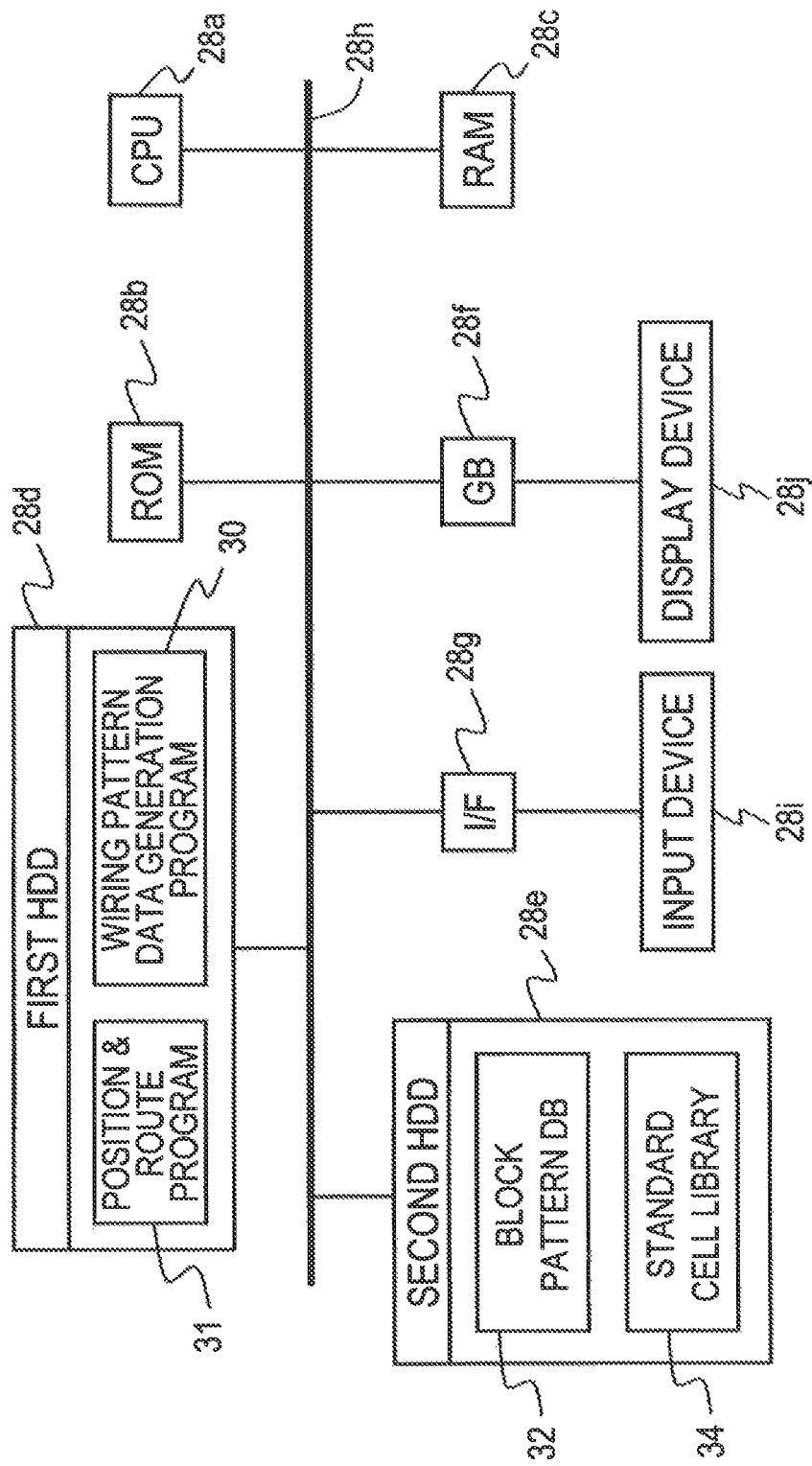
FIG. 4 illustrates a configuration diagram of a computer that executes the wiring pattern data generation method of the present embodiment.

FIG. 4 illustrates a configuration diagram of a computer 28 that executes the wiring pattern data generation method of the present embodiment. As illustrated in FIG. 4, the computer 28 includes CPU (central processing unit) 28a, ROM (read only memory) 28b and RAM (random access memory) 28c. Further, the computer 28 includes first HDD (hard disk drive) 28d, second HDD 28e, GB (graphic board) 28f, I/F (interface) 28g, bus 28h, input device 28i and display device 28j.

The CPU 28a is a processor that controls each hardware device in the computer 28. The CPU 28a loads a program recorded in the first hard disk 28d, and executes the loaded program.

In the first hard disk (storage medium) 28d, there is recorded a wiring pattern data generation program 30 to allow the computer 28 to execute the wiring pattern data generation method according to the present embodiment. By the execution of the above wiring pattern data generation program 30, the computer 28 becomes a wiring pattern data generation apparatus. In the first hard disk 28d, programs to support the wiring pattern data generation program 30 such as a logic synthesis program (not illustrated) and a position & route program 31 are also recorded.

In the ROM 28b, a basic program etc. to be executed by the CPU 28a is recorded. In the RAM 28c, data in the middle of calculation when the CPU 28a executes various kinds of calculation processing are temporarily recorded, as well as programs.

In the second hard disk (storage medium) 28e, there are recorded a block pattern database 32, which will be described later, and a standard cell library 34. In the standard cell library 34, the function of a standard cell (a circuit having a standard function) and a cell pattern of the standard cell are recorded.

The GB 28f executes rendering processing according to instructions received from the CPU 28a, converts an obtained image data into a video signal, and supplies it to the display device 28j. The I/F 28g modifies the expression format of a data input to the input device 28i, and forwards it to the CPU 28a etc.

The CPU 28a, the ROM 28b, the RAM 28c, the first HDD 28d, the second HDD 28e, the GB 28f and the I/F 28g are connected to the bus 28h. Data exchange among the above hardware devices is carried out through the bus 28h.

The display device 28j is, for example, an LCD (liquid crystal display) monitor, and displays the video signal supplied from the GB 28f. The input device 28i includes, for example, a keyboard and a mouse, and generates a data according to a user operation, so as to supply it to the IP (interface) 28g.

When the logic synthesis program (not illustrated) loaded on the RAM 28c is initiated, the computer 28 describes the IC specification with logic expressions. Further, the computer 28 converts the described logic expressions into a net list.

When the position & route program 31 is initiated, the computer 28 disposes a cell pattern registered in the standard cell library 34 upon a cell pattern layout plane, according to the net list.

In the standard cell library 34, there are registered cell patterns (circuit patterns) of logic gates, memory cells, peripheral circuits, etc. Each cell pattern has a three-dimensional structure in which a plurality of pattern layers are stacked.

The number of layers in one logic gate is small. Therefore, substantially entire cell patterns related to the logic gates may be disposed on the cell pattern layout plane (gate layer) dedicated to the cell patterns.

On the other hand, the number of layers in a memory and a peripheral device circuit is large. Therefore, a portion of patterns in the memory and the peripheral device circuit may also be disposed on a wiring pattern formation plane (wiring layer).

The computer 28 sets a wiring area on a wiring pattern formation plane while avoiding an area where the cell patterns of the memory and the peripheral device circuits are disposed. The wiring pattern is formed on the above wiring area.

Thereafter, the wiring pattern data generation program 30 is initiated, and the computer 28 executes the wiring pattern data generation method according to the present embodiment.

Figure 5:
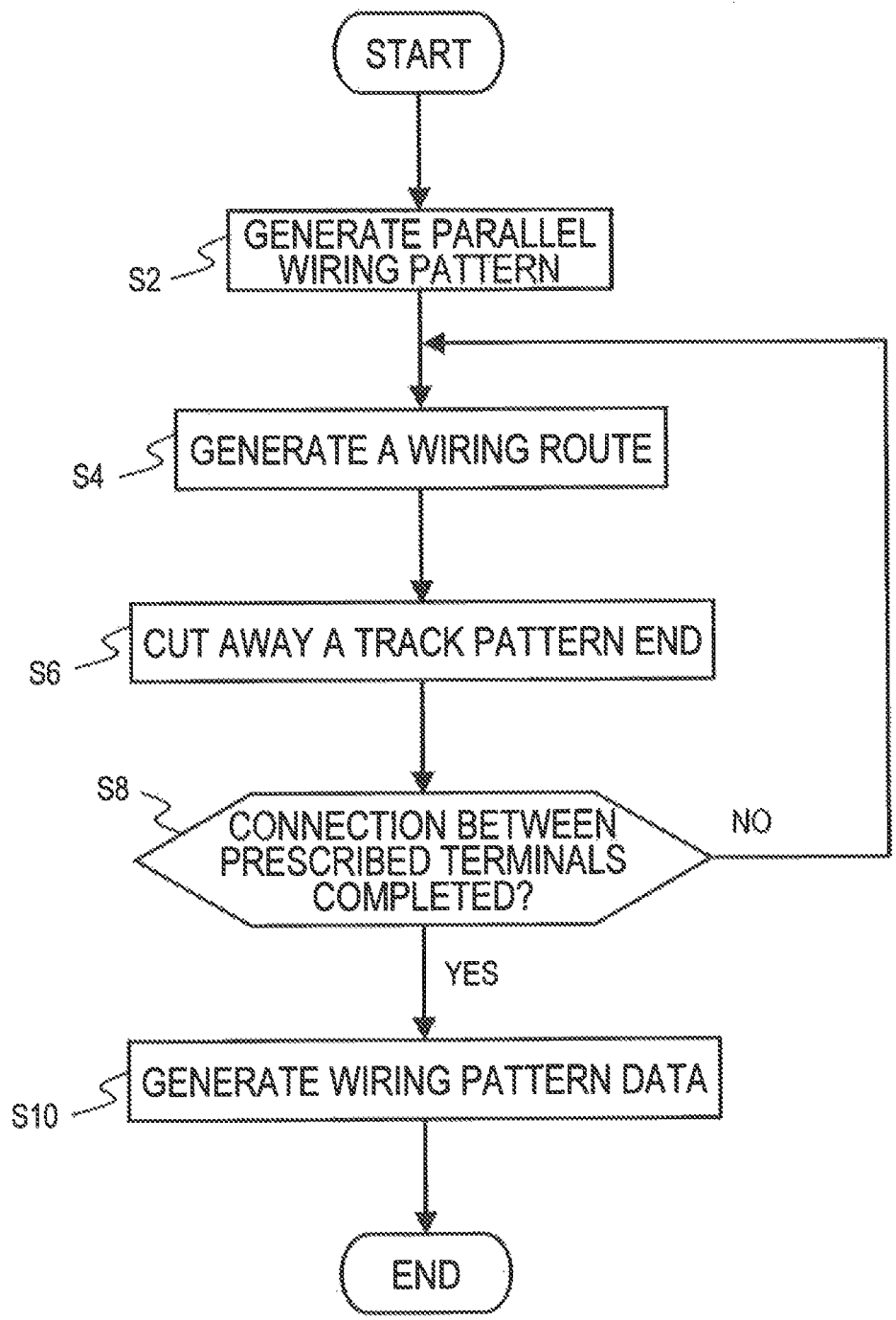
FIG. 5 is a flowchart illustrating the wiring pattern data generation method according to the present embodiment.

FIG. 5 is a flowchart illustrating the wiring pattern data generation method according to the present embodiment. As illustrated in FIG. 5, the wiring pattern data generation method includes parallel wiring pattern generation step (S2), wiring route generation step (S4), track pattern terminal end cut-away step (S6), connection completion decision step (S8) and wiring pattern data generation step (S10).

—Parallel Wiring Pattern Generation Step (S2)—

Figure 6:
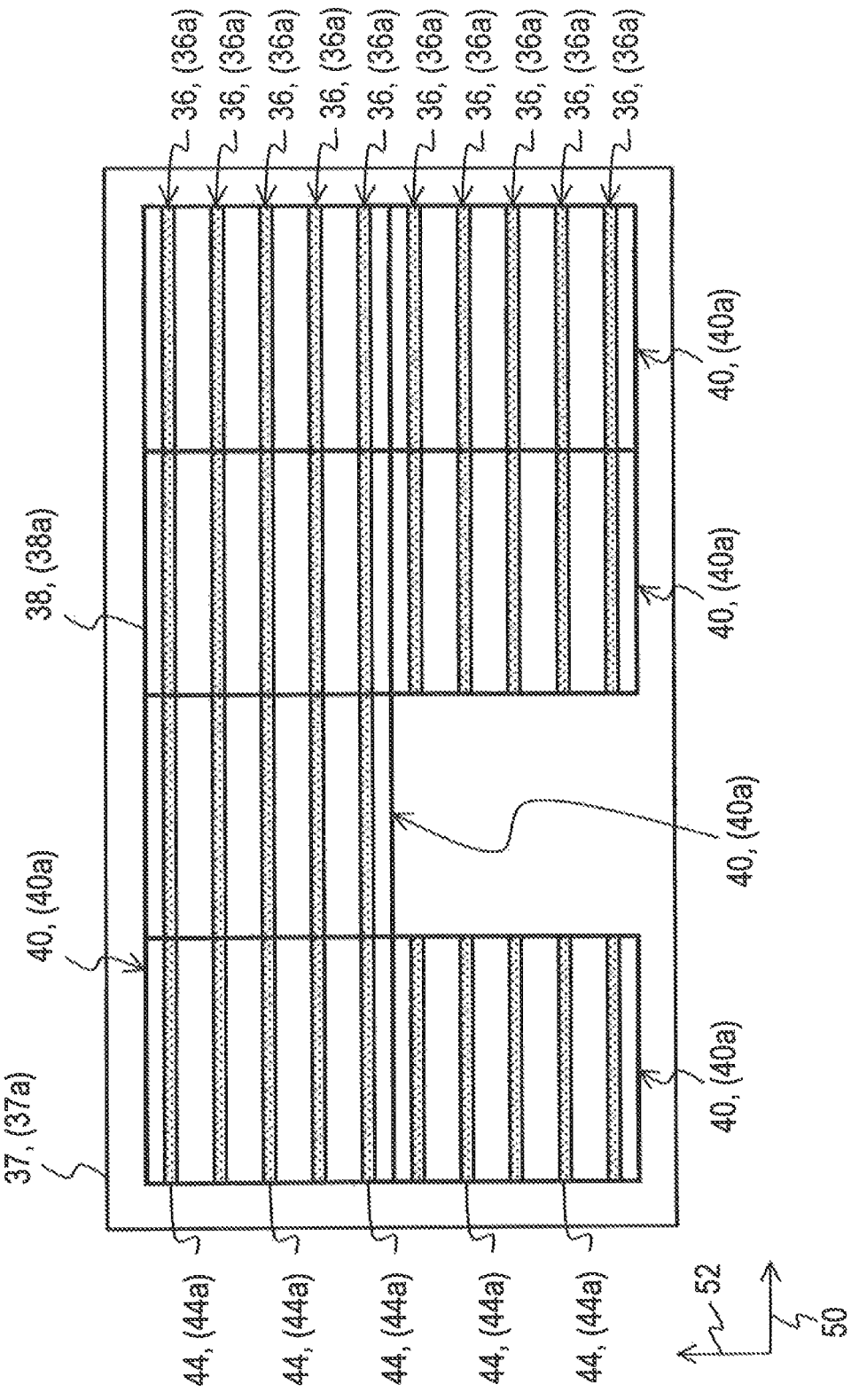
FIG. 6 illustrates an example of a plurality of parallel wiring patterns generated by a parallel wiring pattern generation step.
Figure 7:
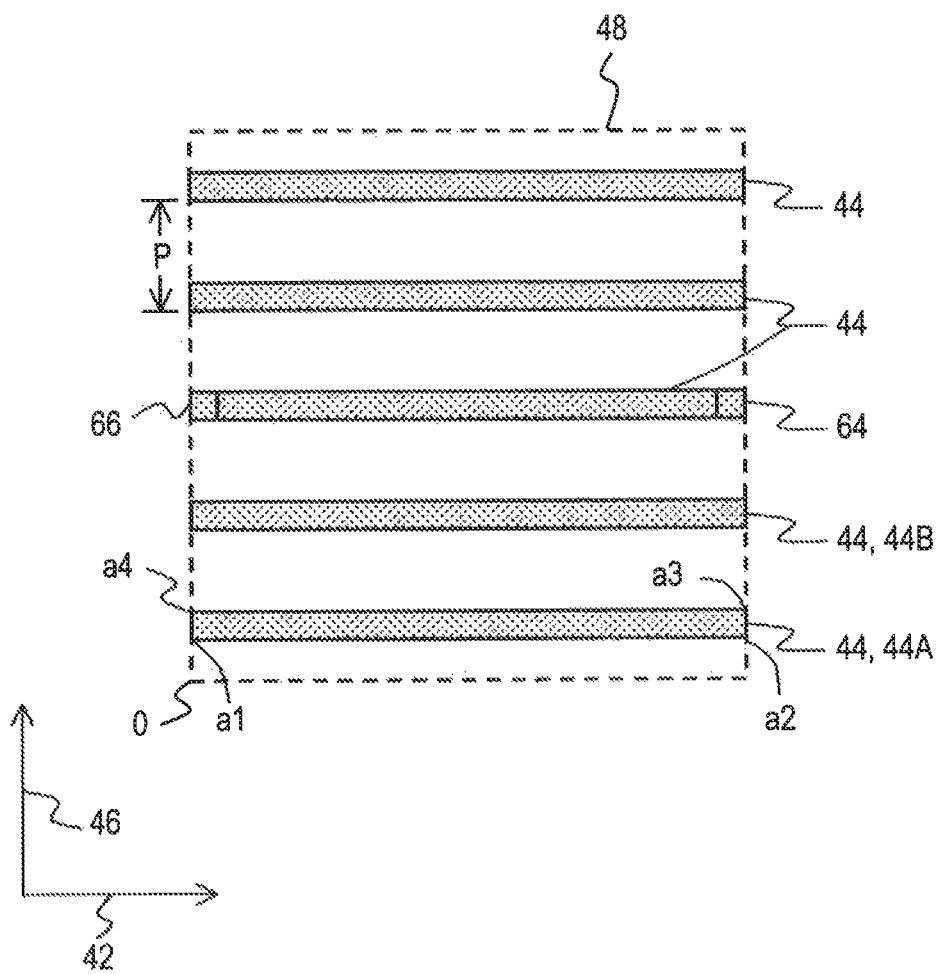
FIG. 7 illustrates an example of a basic block pattern disposed on a wiring area.

FIG. 6 illustrates an example of a plurality of parallel wiring patterns 36 generated by a parallel wiring pattern generation step (S2). FIG. 7 illustrates an example of a basic block pattern 40 disposed on a wiring area 38.

As illustrated in FIG. 7, the basic block pattern 40 includes a plurality of track patterns (stripe-shaped patterns) 44 that extends to one direction 42. The track patterns 44 are disposed at a prescribed pitch P in an intersection direction 46 intersecting (preferably orthogonal) to the one direction 42. Here, broken lines 48 illustrate the outer lines of the basic block pattern 40.

As illustrated in FIG. 6, in the wiring area 38 of a wiring pattern formation plane 37, the computer 28 connects a plurality of basic block patterns 40, so as to generate the plurality of parallel wiring patterns 36 in which the track patterns 44 are connected together. Further, the computer 28 generates a plurality of second parallel wiring patterns on a second wiring pattern formation plane to be stacked above the wiring pattern formation plane 37 (hereafter referred to as a first wiring pattern formation plane). The first wiring pattern formation plane and the second wiring pattern formation plane respectively correspond to a lower wiring layer and an upper wiring layer of three-dimensional wiring included in the IC.

Hereafter, a parallel wiring pattern 36a generated on the first wiring pattern formation plane is referred to as a first parallel wiring pattern. The wiring area provided on the first wiring pattern formation plane 37a is referred to as a first wiring area. Also, each basic block pattern connected in the first wiring area 38a is referred to as a first basic block pattern. Each track pattern included in the first basic block pattern is referred to as a first track pattern.

Figure 8:
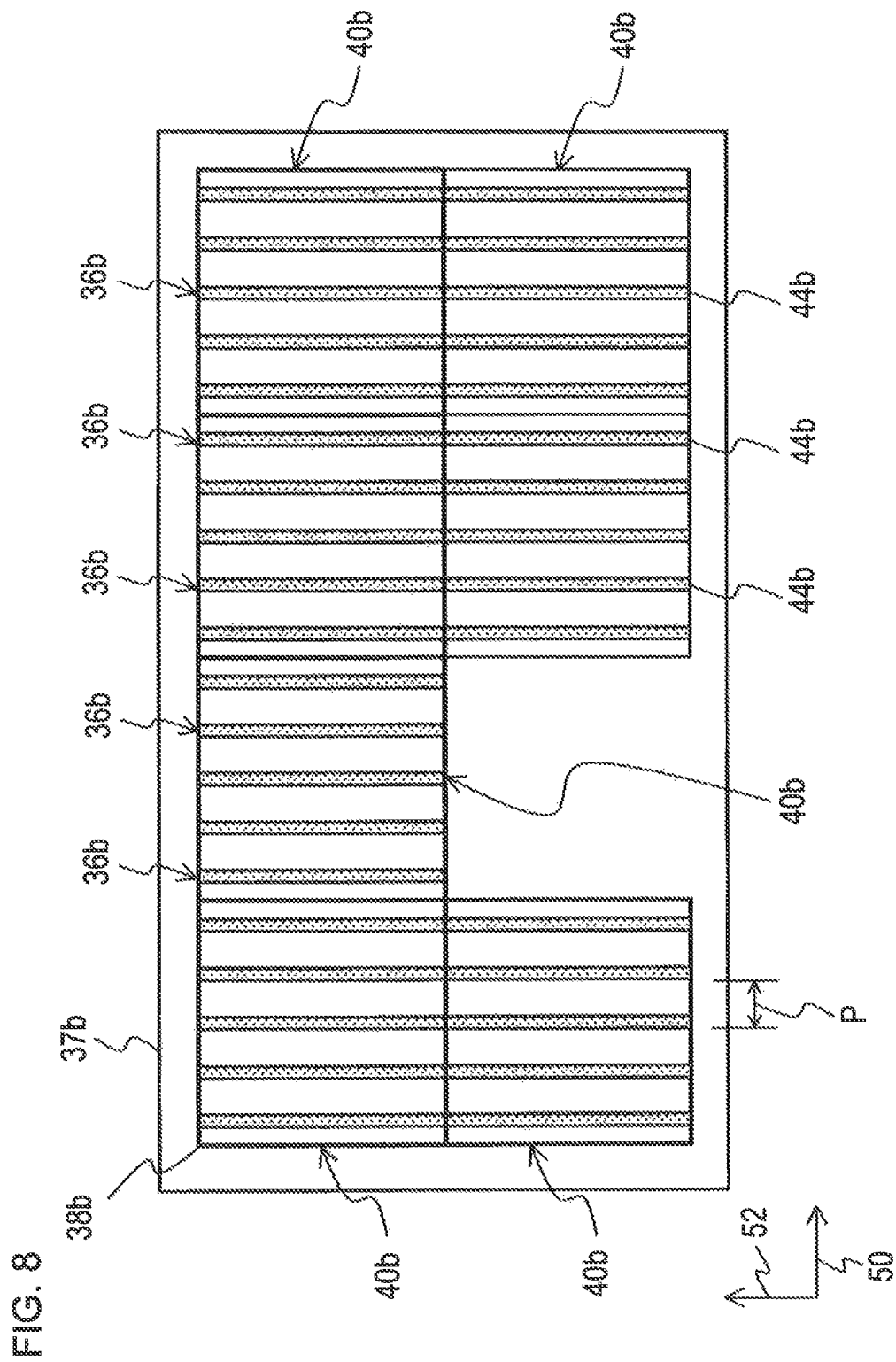
FIG. 8 illustrates an example of a second parallel wiring pattern.

FIG. 8 illustrates an example of a second parallel wiring pattern. As illustrated in FIG. 8, in a second wiring area 38b of a second wiring pattern formation plane 37b, the computer 28 connects second basic block patterns 40b, so as to generate a plurality of second parallel wiring patterns 36b.

Preferably, the first wiring area 38a and the second wiring area 38b have the same shape and size, and are disposed on the same position in the first wiring pattern formation plane 37a and the second wiring pattern formation plane 37b.

As illustrated in FIG. 6, on a first basic block pattern 40a, a plurality of first track patterns 44a extending to a first direction 50 are disposed at the prescribed pitch P in a second direction (preferably, a direction orthogonal to the first direction) 52. On the other hand, on a second basic block pattern 40b, a plurality of second track patterns 44b extending to the second direction 52 are disposed with the prescribed pitch P in the first direction 50.

The computer 28 handles the track patterns 44 and the basic block patterns 40 as graphic data. For example, the track patterns 44 are handled as a set of the vertex coordinates thereof. Accordingly, the basic block patterns 40 are handled as a plurality of sets of the vertex coordinates corresponding to the respective track patterns.

Now, as illustrated in FIG. 7, let coordinates O of the vertex on the lower left of the basic block pattern 40 be an origin (0 nm, 0 nm). Also, let the length and the width of each track pattern 44 be 1 μm and 28 nm, respectively. Further, let the pitch P of the track pattern be 112 nm (=28 nm×4).

In this case, a track pattern 44A at the bottom is handled as a set of four vertex coordinates, namely a1 (0 nm, 42 nm), a2 (1,000 nm, 42 nm), a3 (1,000 nm, 70 nm) and a4 (0 nm, 70 nm). The graphic data of a track pattern 44B at the second from the bottom is handled as a set of four vertex coordinates (0 nm, 154 nm), (1,000 nm, 154 nm), (1,000 nm, 182 nm) and (0 nm, 182 nm).

The basic block pattern 40 is handled as a set of such four vertex coordinates. Processing on the track pattern and the basic block pattern (disposing, cutting away and cutting out) is executed on such image data.

—Wiring Route Generation Step (S4)—

Figure 9:
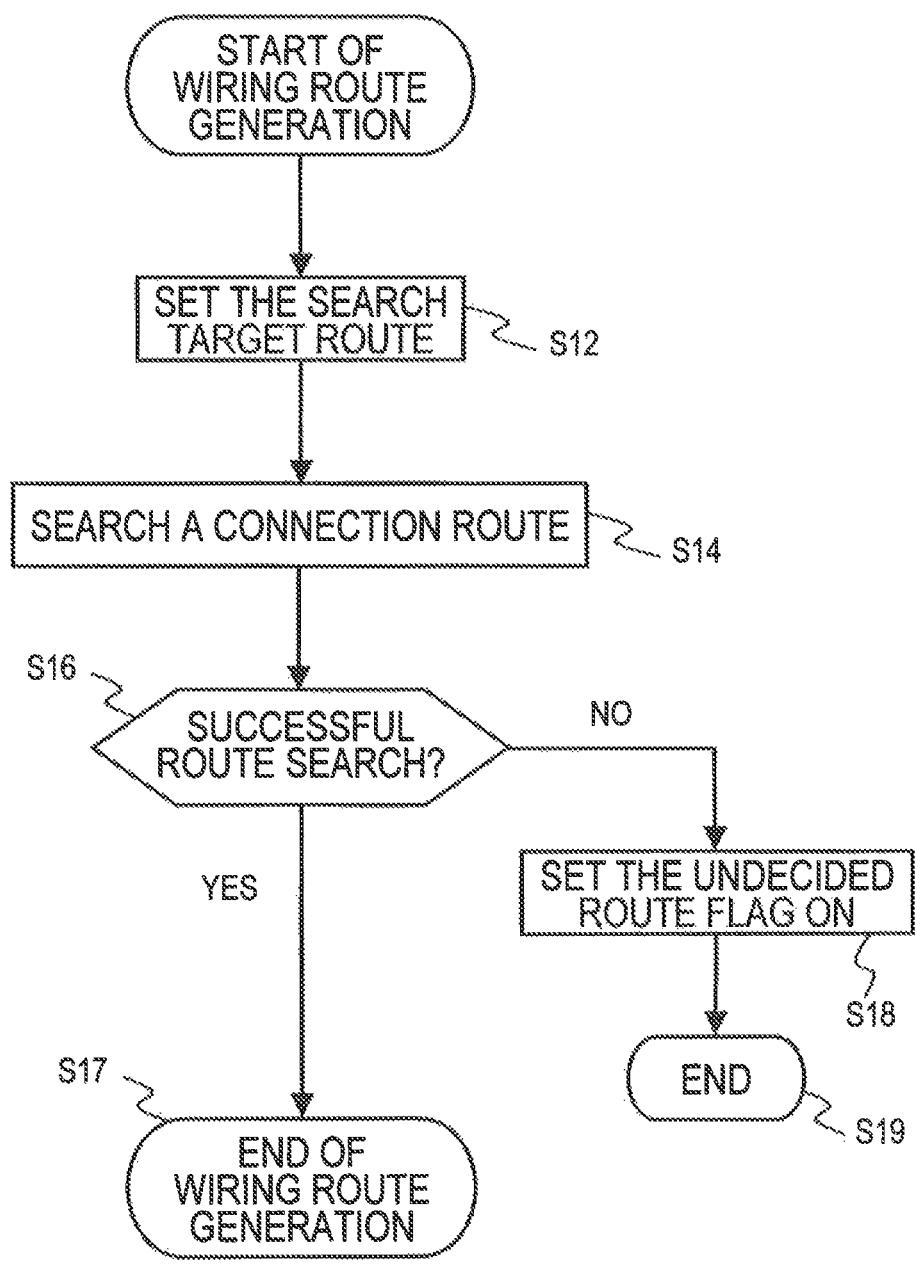
FIG. 9 is a flowchart illustrating a wiring route generation step.

FIG. 9 is a flowchart illustrating a wiring route generation step (S4).

Figure 10:
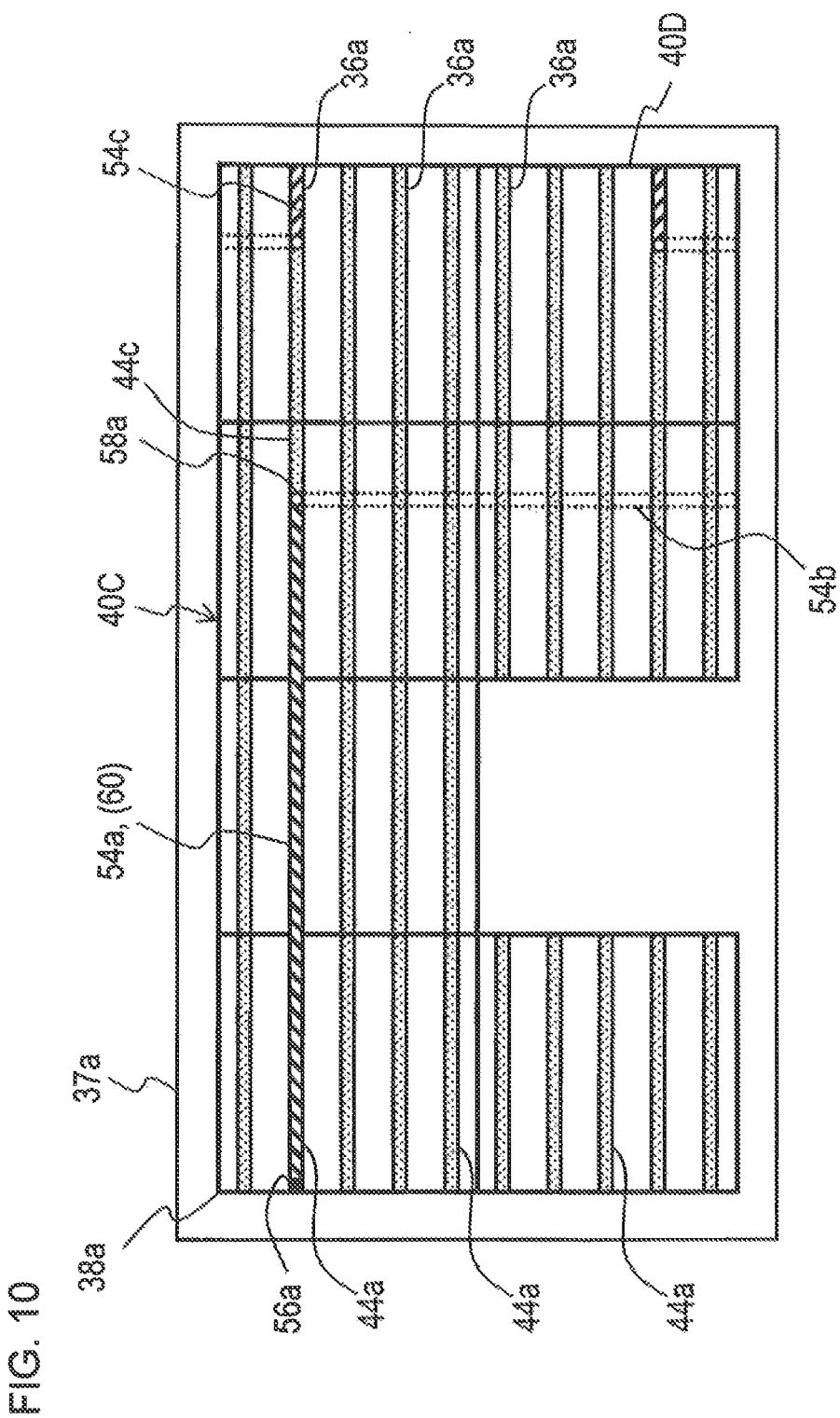
FIG. 10 is a pattern diagram explaining the wiring route generation step.
Figure 11:
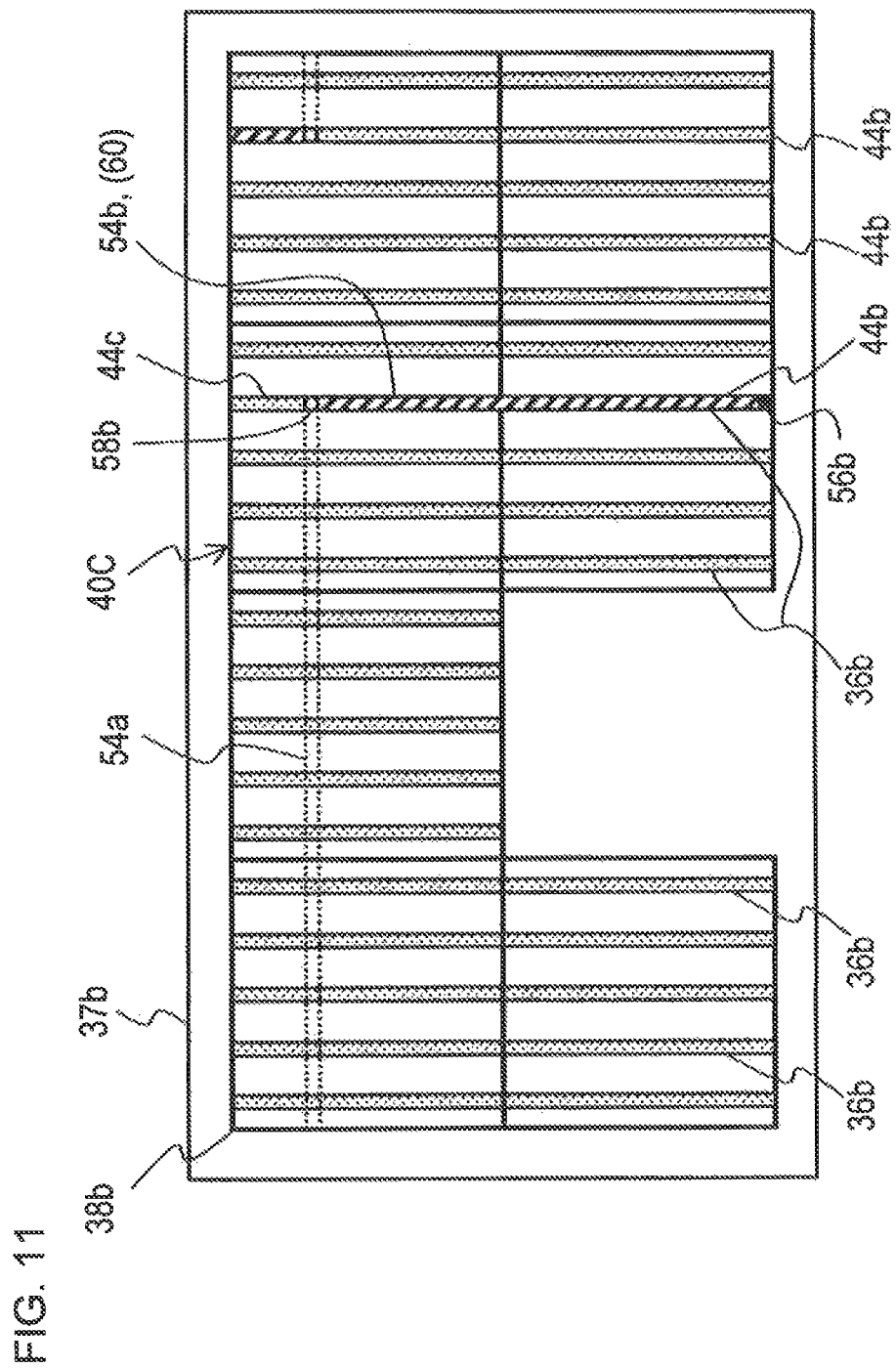
FIG. 11 is a pattern diagram explaining the wiring route generation step.

FIGS. 10 and 11 are pattern diagrams explaining the wiring route generation step.

FIG. 10 illustrates a first wiring route 54a generated in the first wiring area 38a. FIG. 11 illustrates a second wiring route 54b generated in the second wiring area 38b.

As illustrated in FIG. 9, the wiring route generation step (S4) includes a search-target terminal set step (S12), a connection route search step (S14), a route search success/failure decision step (S16) and an undecided route flag ON step (S18).

—Search-Target Terminal Set Step (S12)—

When disposing a cell pattern on the cell pattern layout plane and/or the wiring pattern formation plane, the computer 28 disposes an external terminal pattern of the cell pattern (or a via terminal pattern connected to the external terminal pattern via a via pattern) on the wiring pattern formation plane. The above terminal patterns (the external terminal pattern and the via terminal pattern) are connected to the end of the parallel wiring patterns 36a, 36b by the wiring pattern formed outside the wiring area by the VSB method. Alternatively, the above terminal patterns are directly provided in the parallel wiring patterns 36a, 36b.

The computer 28 successively selects a plurality of terminal patterns 56a, 56b (hereafter referred to as search-target terminal points) from connection points between the wiring pattern outside the wiring area and the parallel wiring patterns 36a, 36b, and the terminal patterns directly provided in the parallel wiring patterns 36a, 36b. The search-target terminal points are selected based on the connection between terminals defined in the net list.

In FIG. 10, the connection point provided on one end of the first track pattern 44a, disposed on the left end of the first wiring area 38a, is selected as a first search-target terminal point 56a. Also, in FIG. 11, the connection point provided on one end of the second track pattern 44b, disposed on the lower end of the second wiring area 38b, is selected as a second search-target terminal point 56b.

With regard to the search-target terminal set step (S12), more concrete explanation will be given in the embodiment 4.

—Connection Route Search Step (S14)—

Next, the computer 28 searches for a connection route 60 that connects between the search-target terminal points 56a, 56b selected above, through the track patterns 44a, 44b. At this time, as illustrated in FIGS. 10 and 11, the computer 28 generates wiring routes (routes in the wiring pattern) 54a, 54b running on the track patterns 44a, 44b, as a portion of or the entire connection routes 60.

For example, the first wiring route 54a (FIG. 10), which is connected to the first search-target terminal point 56a, and the second wiring route 54b (FIG. 11), which is connected to the second search-target terminal point 56b, are generated. The connection route search is carried out using almost the same procedure as a route search tool provided in the position & route program performs.

When generating the wiring routes, the computer 28 generates the wiring routes 54a, 54b in such a manner that route ends in different wiring routes (for example, the first wiring route 54a and a third wiring route 54c) are not disposed in the same track pattern.

Additionally, in FIG. 10, the second wiring route 54b is depicted with broken lines, for reference sake. Similarly, in FIG. 11, the first wiring route 54a is depicted with broken lines.

When a connection route search to connect between the search-target terminal points is successful, the computer 28 terminates the wiring route generation step (S17). On the other hand, when the connection route search fails, the computer 28 sets an undecided route flag ON, and suspends the wiring pattern data generation (S19).

As illustrated in FIGS. 10 and 11, if the connection route 60 lies across a plurality of wiring pattern formation planes, the computer 28 generates a connection via pattern that connects a first route end 58a of the first wiring route 54a to a second route end 58b of the second wiring route 54b.

Figure 12:
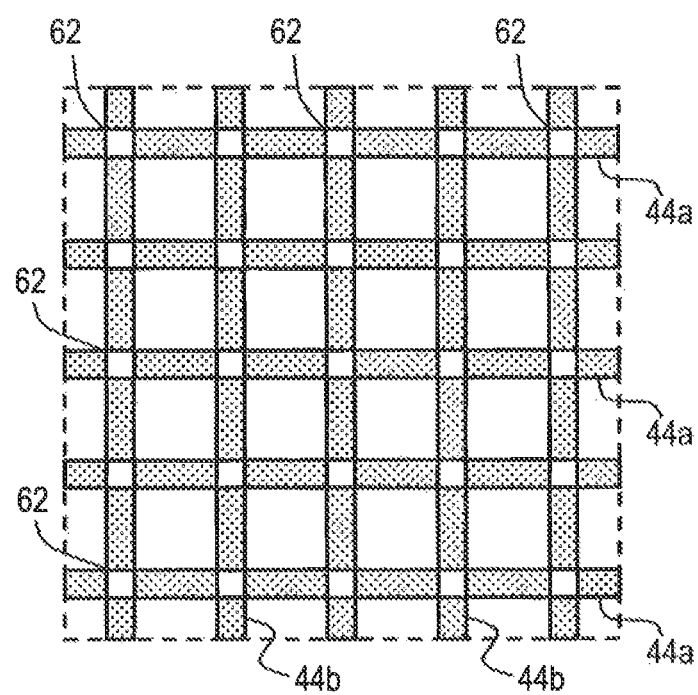
FIG. 12 is a diagram explaining the layout position of the connection via pattern.

FIG. 12 is a diagram explaining the layout position of the connection via pattern. The first wiring pattern formation plane 37a and the second wiring pattern formation plane 37b respectively correspond to the lower wiring layer and the upper wiring layer of the three-dimensional wiring. Therefore, a position in the first wiring pattern formation plane and a position in the second wiring pattern formation plane have one-to-one correspondence.

By overlaying the first wiring pattern formation plane 37a with the second wiring pattern formation plane 37b in such a manner that corresponding positions of the respective wiring pattern formation planes are mutually overlaid, there are generated a plurality of grid points 62 at which the first track pattern 44a intersects with the second track pattern 44b. A connection via for connecting the first route end 58a to the second route end 58b is disposed at one of the plurality of grid points 62.

Here, the grid points 62 respectively exist on the first wiring pattern formation plane 37a, the second wiring pattern formation plane 37b and a via pattern layout plane to be disposed between the first wiring pattern formation plane 37a and the second wiring pattern formation plane 37b.

The connection via pattern is disposed on a grid point of the via pattern layout plane. The via pattern layout plane having connection vias disposed on the grid points is a via layer pattern of the IC layout pattern.

In the above example, the connection route 60 includes a plurality of wiring routes. However, when the search-target terminal point 56a, 56b are provided on one of the parallel wiring patterns, the connection route between the search-target terminal points coincides with the wiring route.

—Track Pattern Terminal End Cut-Away Step (S6)—

Figure 13:
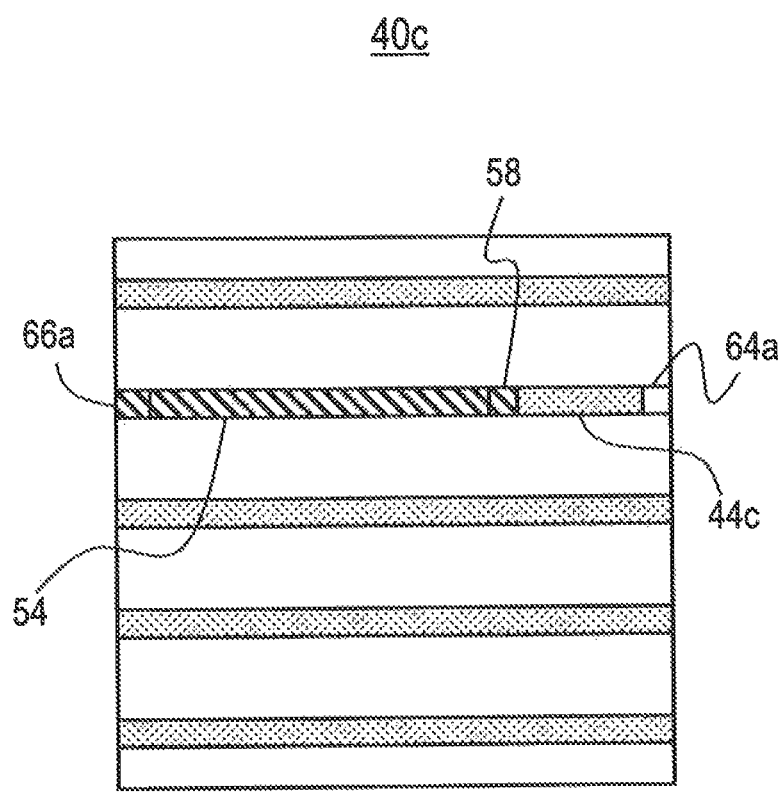
FIG. 13 is a diagram explaining a track pattern terminal end cut-away step.
Figure 14:
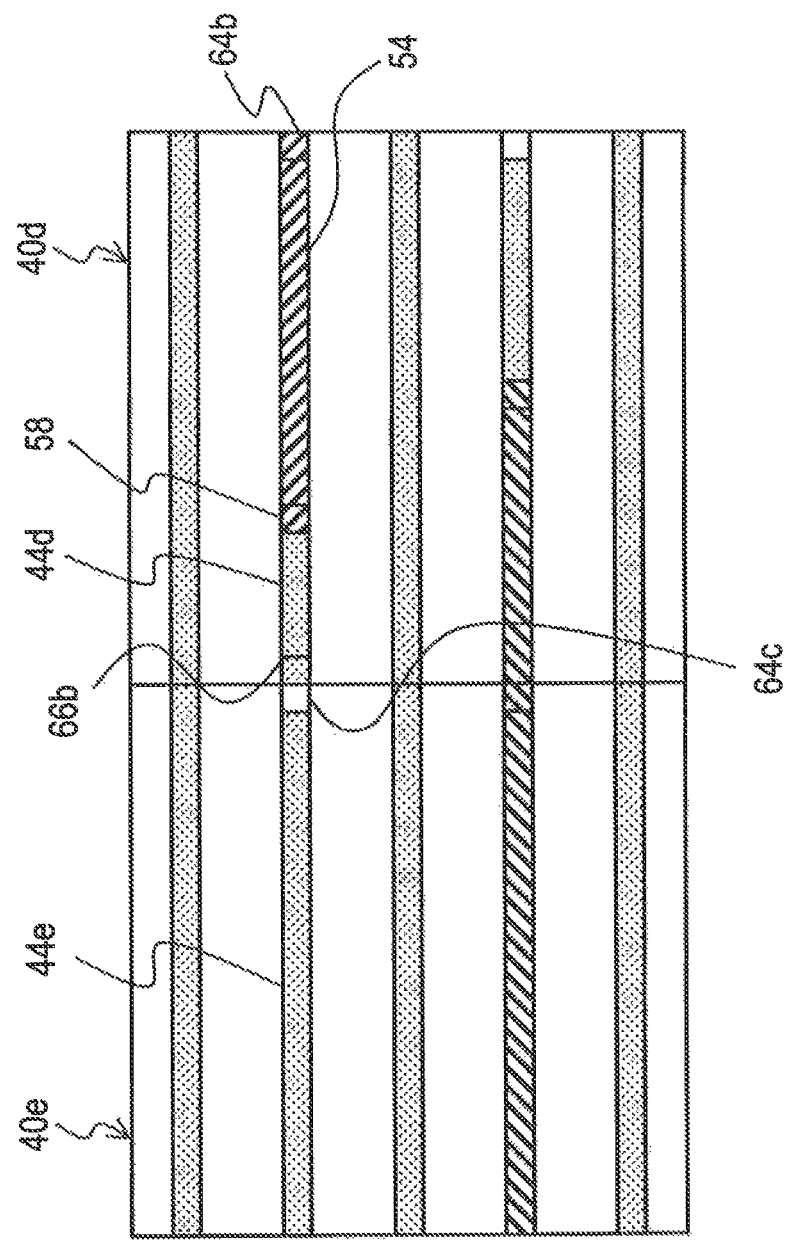
FIG. 14 is a diagram explaining a track pattern terminal end cut-away step.

FIGS. 13 and 14 are diagrams explaining a track pattern terminal end cut-away step. FIG. 13 illustrates a basic block pattern 40c having a route end 58 disposed thereon. The basic block pattern 40c corresponds to the basic block pattern 40C depicted in FIG. 10.

FIG. 14 illustrates a basic block pattern 40d having the route end 58 disposed thereon and a basic block pattern 40e adjacent to the basic block pattern 40d. In the basic block pattern 40c of FIG. 13, a wiring route 54 runs on a track pattern start end 66a. On the other hand, in the basic block pattern 40d depicted in FIG. 14, the wiring route 54 runs on a track pattern terminal end 64b. The basic block pattern 40d depicted in FIG. 14 corresponds to a basic block pattern 40D depicted in the lower right end of FIG. 10. Here, the track pattern start end is a track pattern end on the starting point side of the direction (extending direction) to which the track pattern extends. Also, the track pattern terminal end is a track pattern end on the ending point side of the extending direction of the track pattern.

As illustrated in FIGS. 13 and 14, the computer 28 cuts away (i.e. removes) a track pattern terminal ends 64a on which no wiring route 54 runs, out of the track pattern terminal ends 64a, 64b of the track patterns 44c, 44d on which the route ends 58 is disposed. The route ends 58 are, for example, the first route end 58a and the second route end 58b depicted in FIGS. 10 and 11. The wiring route 54 is, for example, the first wiring route 54a and the second wiring route 54b depicted in FIGS. 10 and 11. The width of the portion to be cut away is the width of the track pattern 44c, for example.

Further, as illustrated in FIG. 14, the computer 28 cuts away a track pattern terminal end 64c on which no wiring route 54 runs, out of the track pattern terminal ends of adjacent track patterns (e.g. an adjacent track pattern 44e) connected to the track pattern start end 66a, 66b of the track pattern 44c, 44d on which the route end 58 is disposed.

FIGS. 13 and 14 are explanation diagrams of the cut-away step (S6) in regard to the track pattern that extends to one direction (for example, the first direction 50). In regard to the track pattern extending to a direction (for example, the second direction 52) different from the above one direction, similar step is carried out. The same is applicable to the steps described hereafter.

By the above-mentioned track pattern terminal end cut-away processing, the track patterns on which the wiring routes 54a, 54b run are separated from the track patterns on which the wiring routes 54a, 54b do not run (hereafter referred to as "non-running" track patterns). As a result, the connection route 60 is separated from the "non-running" track patterns. Thus, a wiring pattern for connecting the search-target terminal points 56a, 56b is generated.

—Connection Completion Decision Step (S8)—

In the net list, the connection of prescribed terminals (for example, external terminals of the cell pattern) is defined. The computer 28 executes the wiring route generation step (S4) and the track pattern terminal end cut-away step (S6) so that the prescribed terminals are connected via one or a plurality of wiring routes (routes in the wiring pattern).

At this time, each time the track pattern terminal end cut-away step (S6) is completed, the computer 28 sets "ON" the occupation flag of each track pattern on which the wiring route 54 runs. The occupation flag is used to detect an unused track pattern (a track pattern on which other wiring patterns do not run) when a connection route is searched for in the connection route search step (S14).

As illustrated in FIG. 5, when the computer 28 decides that there is an unconnected terminal defined in the net list, the computer 28 executes the wiring route generation step (S4) and the track pattern terminal end cut-away step (S6) upon the unconnected terminal (S8→S4→56). On the other hand, when deciding that the connections of the entire prescribed terminals defined in the net list are completed, the computer 28 proceeds to a wiring pattern data generation step (S10) (S8→S10).

—Wiring Pattern Data Generation Step (S10)—

Next, the computer 28 generates wiring pattern data that include a block pattern identifier corresponding to each basic block pattern in the wiring areas (38a, 38b) and the layout position of the basic block pattern (S10).

Figure 15A:
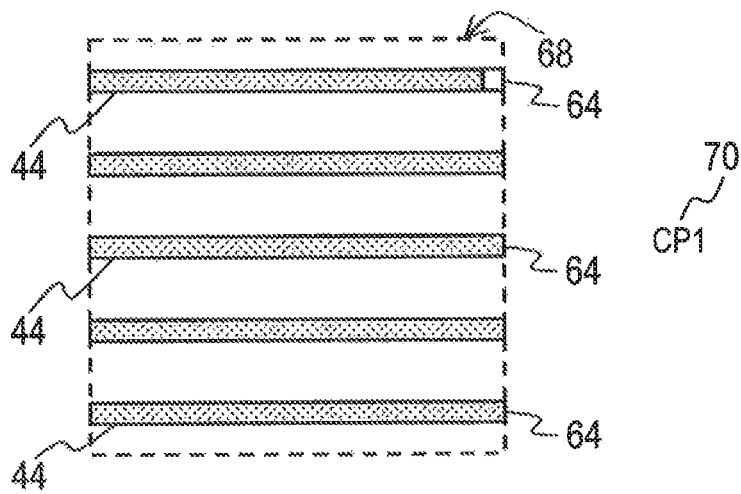
FIG. 15A is a diagram explaining the block pattern identifier.
Figure 15B:
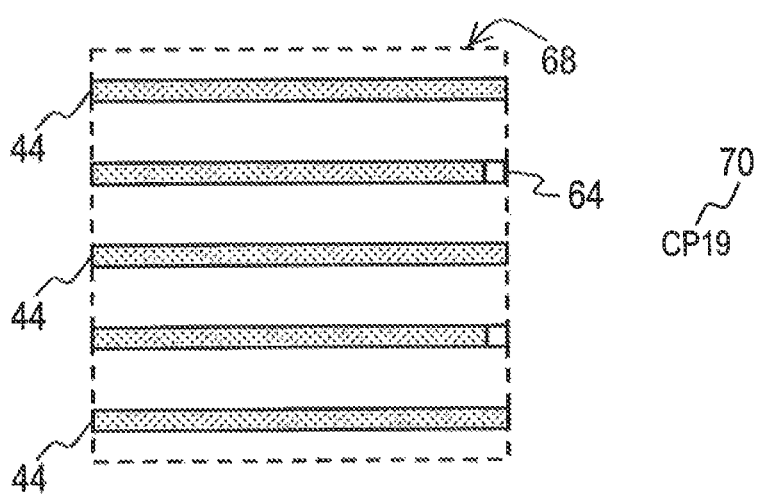
FIG. 15B is a diagram explaining the block pattern identifier.
Figure 15C:
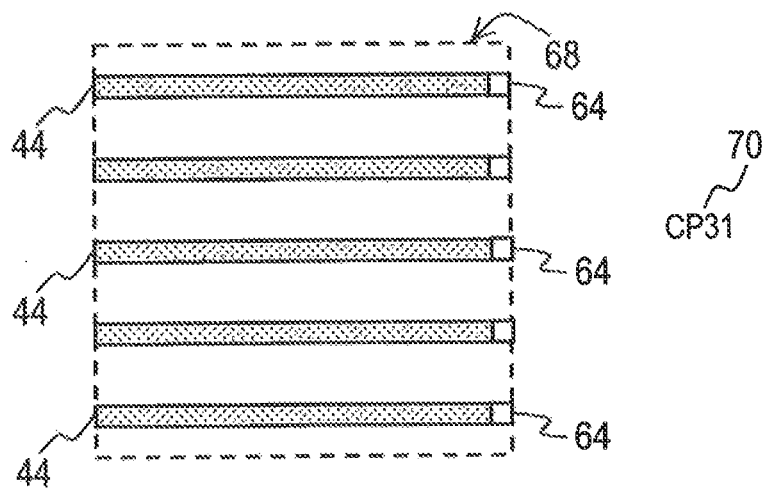
FIG. 15C is a diagram explaining the block pattern identifier.
Figure 16:
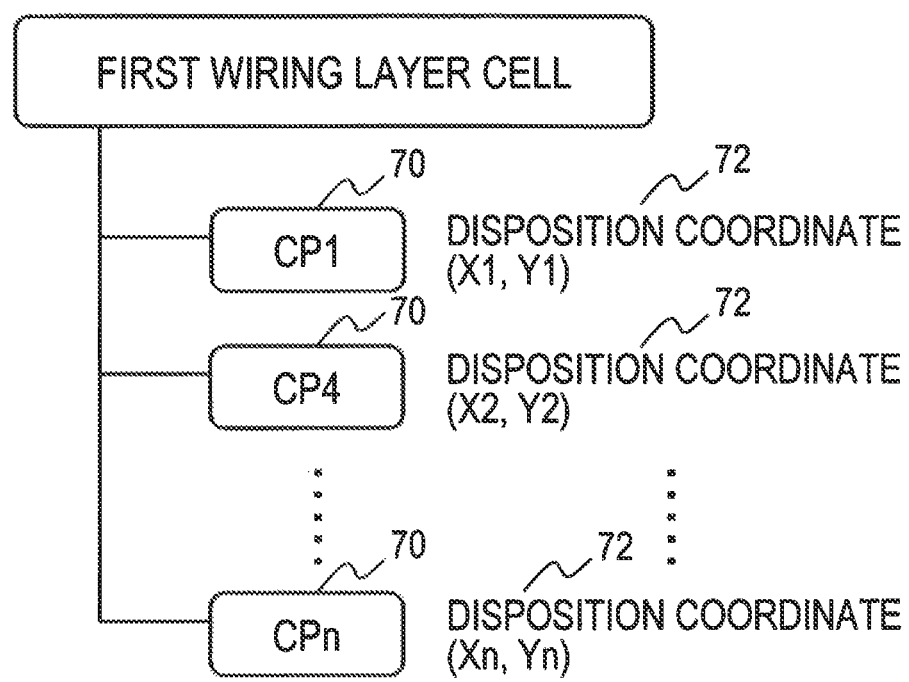
FIG. 16 is a diagram illustrating the data structure of a wiring pattern data.

FIGS. 15A-15C are diagrams explaining the block pattern identifier. FIG. 16 is a diagram illustrating the data structure of a wiring pattern data 74.

In the block pattern database 32 (refer to FIG. 4), cut-away block patterns 68 described later and block pattern identifiers thereof are recorded. Each of the cut-away block patterns 68 corresponds to a block pattern identifier thereof. Also, in the block pattern database 32, the basic block pattern (FIG. 7) having no cut-away track pattern terminal end and a block pattern identifier thereof are recorded. The basic block pattern corresponds to the block pattern identifier thereof. In other words, each block pattern identifier is made correspond to one of a plurality of cut-away block patterns 68 and the basic block pattern in which no track pattern terminal end is cut away. The cut-away block patterns 68 are different from each other.

As illustrated in FIGS. 15A-15C for example, the cut-away block patterns are a plurality of patterns, which are different from each other, generated by cutting away the track pattern terminal ends 64 of the track patterns 44 in included in the basic block pattern.

Here, in FIGS. 15A-15C, the cut-away block patterns including the track patterns extending to one direction (for example, the first direction 50) are depicted. Also, the cut-away block patterns including the track patterns extending to a direction (for example, the second direction 52) different from the above one direction are generated in a similar manner.

After the track pattern terminal end cut-away step (S6), the computer 28 extracts block pattern identifiers 70 corresponding to the basic block patterns in the wiring areas 38a, 38b, from the block pattern database 32. At this time, a block pattern identifier 70 of the cut-away pattern 68 matching each basic block pattern in the wiring areas 38a, 38b is extracted. Next, the computer 28 generates the wiring pattern data 74 including the extracted block pattern identifiers 70 and the layout positions of the basic block patterns (S10).

Here, the layout position of each basic block pattern is represented by the coordinates of a vertex at the lower left of the basic block pattern, for example. In the extracted block pattern identifiers 70, the block pattern identifier of the basic block pattern, in which no track pattern terminal end is cut away, is also included.

In the example depicted in FIG. 16, records including the block pattern identifier 70 and the layout position 72 of the basic block pattern disposed in the wiring area is recorded in a first wiring layer cell (directory).

Further, the computer 28 divides the via pattern layout plane (via layer pattern), having the connection via pattern disposed on the grid point, into subfields, and generates the connection via data including via block pattern identifiers, which correspond to the divided patterns (hereafter referred to as subfield patterns) on the via pattern layout plane, and the positions of the above subfields. The connection via data will be explained in detail in the embodiment 5.

The wiring pattern data and the connection via data are recorded, for example, on the first HDD 28d, as a portion of the IC layout data. In the IC layout data, the cell pattern data are also included. The IC layout data and the connection via data will be described in detail in the embodiment 5.

Now, the number of track patterns included in the cut-away block patterns 68 depicted in FIGS. 15A-15C is 5. Therefore, the cut-away block patterns 68 depicted in FIGS. 15A-15C have 31 variations ($=2^5-1$). It is easy to is provide blocks having such number of variations in the block area 22 (refer to FIG. 3).

As the number of track patterns increases, the number of variations in the cut-away block patterns also increases. For example, in case the number of block patterns is 12, the number of cut-away block patterns becomes 4,095 ($=2^{12}-1$) Since the number of block patterns included in a standard block area 22 is around 4,000, it is still easy to provide the entire blocks relative to the cut-away block patterns in the block area 22, even if the number of track patterns is increased to 12.

Accordingly, in the present embodiment, blocks including apertures having the same shapes as the cut-away block patterns 68 are provided in the block mask area 22. Then, as the block identifier of each block, the block pattern identifier 70 is used.

Thus, the wiring pattern data 74 becomes an exposure data including block identifiers and block exposure positions. Therefore, by performing electron beam exposure using the wiring pattern data 74, the wiring patterns in the wiring areas 38a, 38b are transferred to the resist film 14. Similarly, by using the connection via data as exposure data, the via layer pattern is transferred to the resist film 14.

As such, according to the present embodiment, the wiring patterns are transferred to the resist film 14 by the one-shot exposure of the cut-away block patterns 68 and/or the basic block patterns 40. Accordingly, the throughput of the electron beam exposure relative to the wiring patterns is increased.

The connection route 60 illustrated in FIGS. 10, 11 is a route that connects between two search-target terminal points. However, the connection route 60 may also be a route that connects among three search-target terminal points or more.

Embodiment 2

Figure 17:
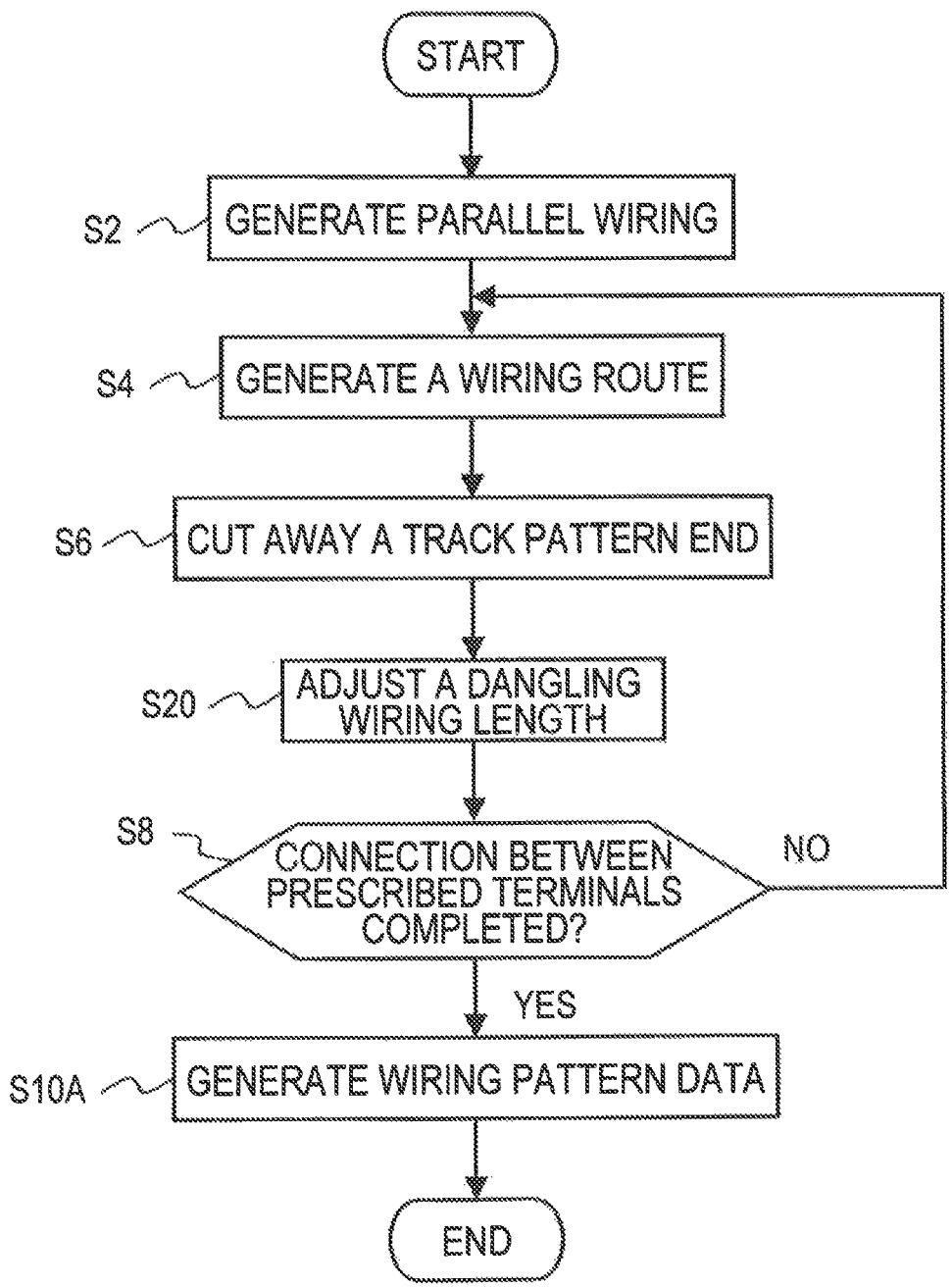
FIG. 17 is a flowchart of the wiring pattern data generation method according to the embodiment 2.

FIG. 17 is a flowchart of the wiring pattern data generation method according to the present embodiment.

As illustrated in FIG. 17, in the wiring pattern data generation method according to the present embodiment, a "dangling wiring length adjustment step (S20)" is provided between the "track pattern terminal end cut-away step (S6)" and the "connection completion decision step (S8)", which are explained with reference to FIG. 5 of the Embodiment 1. Further, a "wiring pattern data generation step (S10A)" generates a wiring pattern data to each wiring pattern having an adjusted dangling wiring length. Hereafter, the description of common portions to the embodiment 1 will be omitted.

—Dangling Wiring Length Adjustment Step (S20)—

Figure 18:
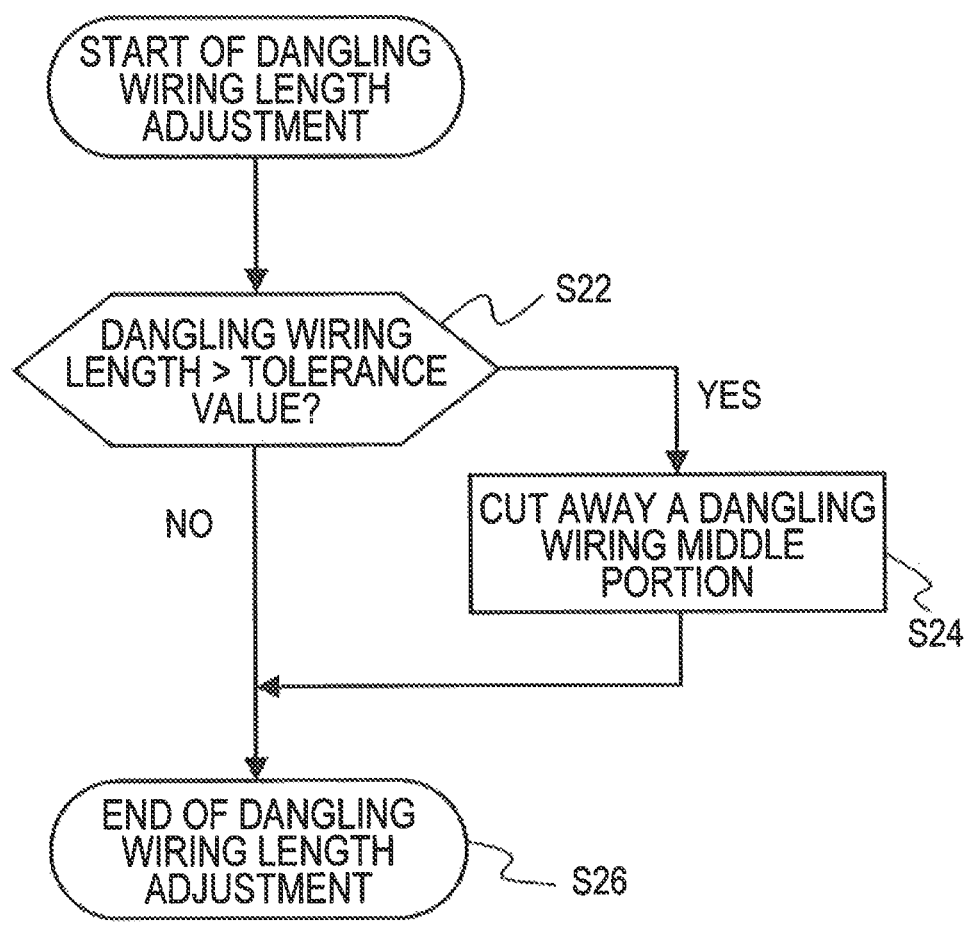
FIG. 18 is a flowchart of the dangling wiring length adjustment step.
Figure 19:
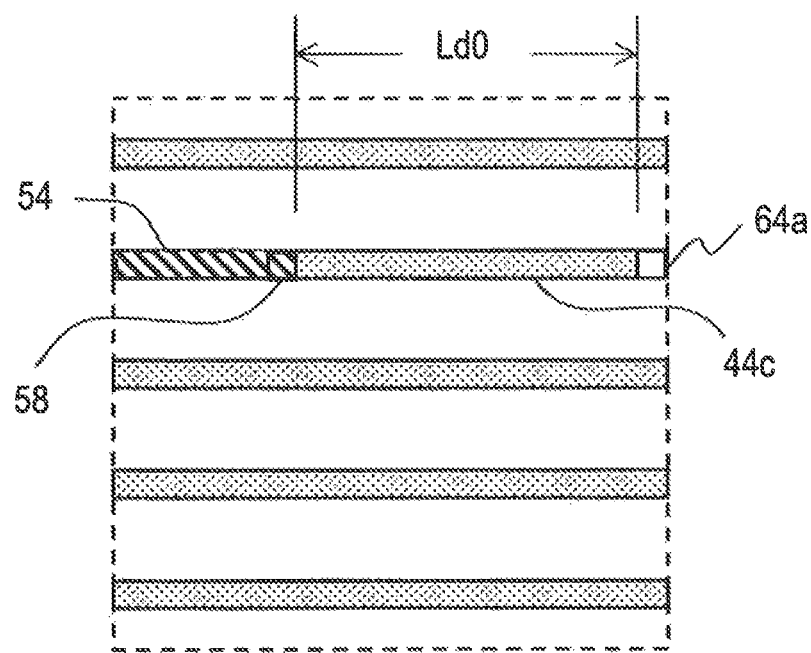
FIG. 19 is a pattern diagram illustrating the dangling wiring length adjustment step.
Figure 20:
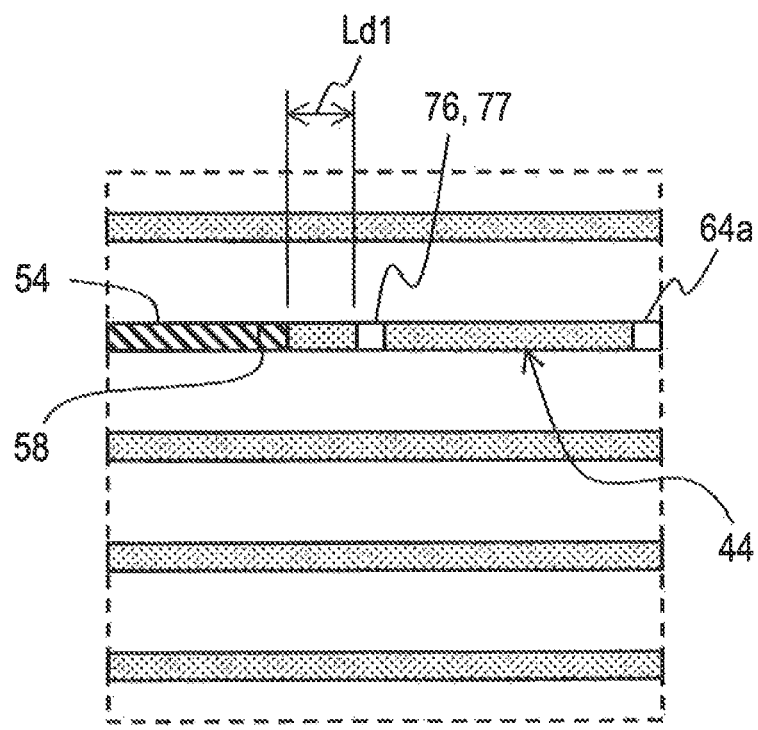
FIG. 20 is a pattern diagram illustrating the dangling wiring length adjustment step.

FIG. 18 is a flowchart of the dangling wiring length adjustment step (S20). FIGS. 19 and 20 are pattern diagrams illustrating the dangling wiring length adjustment step (S20).

After the execution of the "track pattern terminal end cut-away step (S6)", as illustrated in FIG. 19, the computer 28 decides whether a dangling wiring length $L_{d0}$ between the cut-away track pattern terminal end 64a and the route end 58, corresponding to the track pattern terminal end 64a of concern, exceeds a tolerance value (for example, half the track pattern length) (S22). The tolerance value of the dangling wiring length $L_{d0}$ is defined by the magnitude of a reflected wave produced at the track pattern terminal ends, for example.

If the dangling wiring length $L_{d0}$ is less than or equal to the tolerance value, the computer 28 completes the dangling wiring length adjustment step (S20) (in S26). If the dangling wiring length $L_{d0}$ exceeds the tolerance value, as illustrated in FIG. 20, the computer 28 cuts away a dangling wiring middle portion 76 between the track pattern terminal end 64a and the route end 58 (S24).

At this time, the dangling wiring middle portion (for example, the center of the track pattern 44) 76 is cut-away so that a dangling wiring length $L_{d1}$ between a portion 77 to be cut-away and the route end 58 becomes less than or equal to the tolerance value.

—Wiring Data Generation Step (S10A)—

Figure 21:
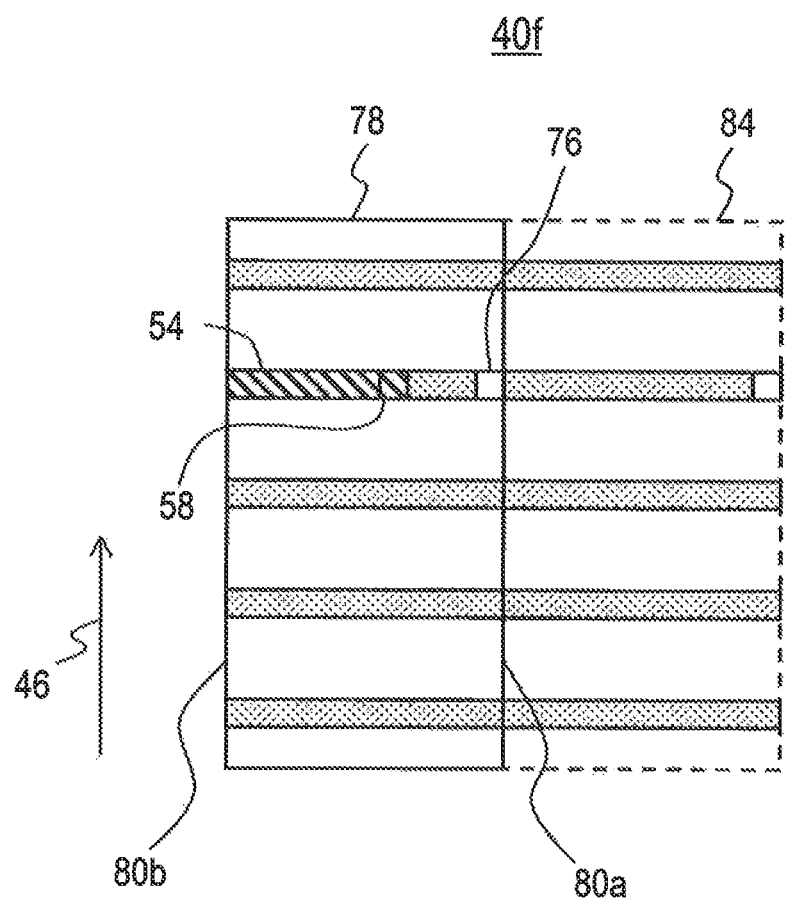
FIG. 21 is a pattern diagram explaining the wiring pattern data generation step.
Figure 22A:
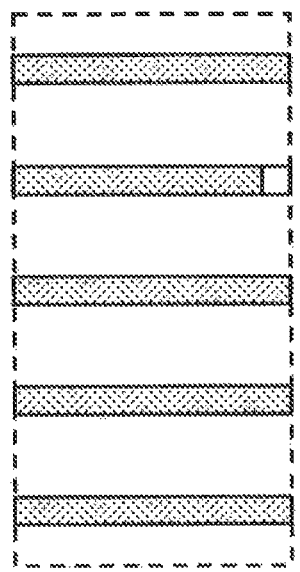
FIG. 22A is a pattern diagram explaining the wiring pattern data generation step.
Figure 22B:
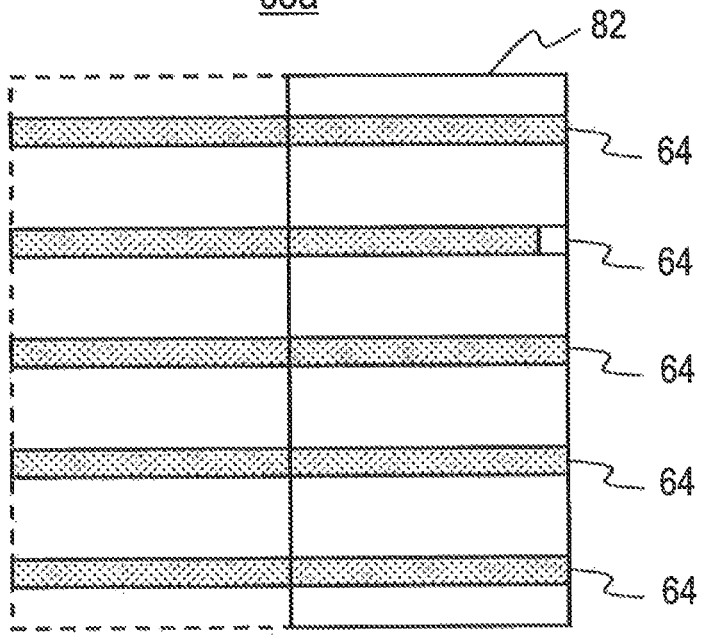
FIG. 22B is a pattern diagram explaining the wiring pattern data generation step.

FIGS. 21 and 22A-22B are pattern diagrams explaining the wiring pattern data generation step (S10A). First, as illustrated in FIG. 21, the computer 28 cuts out a pattern (hereafter referred to as partial block pattern) in a cutout frame 78 from a basic block pattern 40f in which the dangling wiring middle portion 76 has been cut-away.

As illustrated in FIG. 21, the cutout frame 78 includes a first end side 80a and a second end side 80b opposite to the first end side 80a. The first end side 80a is a side transversal across the basic block pattern 40f in the intersection direction 46 (refer to FIG. 7) and connected to the cut-away dangling wiring middle portion 76 from the opposite side of the wiring route 54. The second end side 80b is a side opposite to the first end side 80a and connected to the basic block pattern 40f.

FIG. 22A illustrates an exemplary partial block pattern 86 cut-away from the basic block pattern 40f. Also, FIG. 22b illustrates a cut-away block pattern 68a corresponding to the above partial block pattern 86.

The partial block pattern 86 depicted in FIG. 22A matches an area 82 (hereafter referred to as end-side area) on the track pattern terminal end 64 side of the cut-away block pattern 68a depicted in FIG. 22B. As such, the partial block pattern 86 matches the end-side area 82 of one cut-away block pattern 68a.

Then, in the "wiring data generation step (S10A)", wiring pattern data are generated by use of a partial block pattern identifier corresponding to both the partial block pattern 86 which has been cut out and the cut-away block pattern having the end-side area 82 matching the partial block pattern 86.

Figure 23:
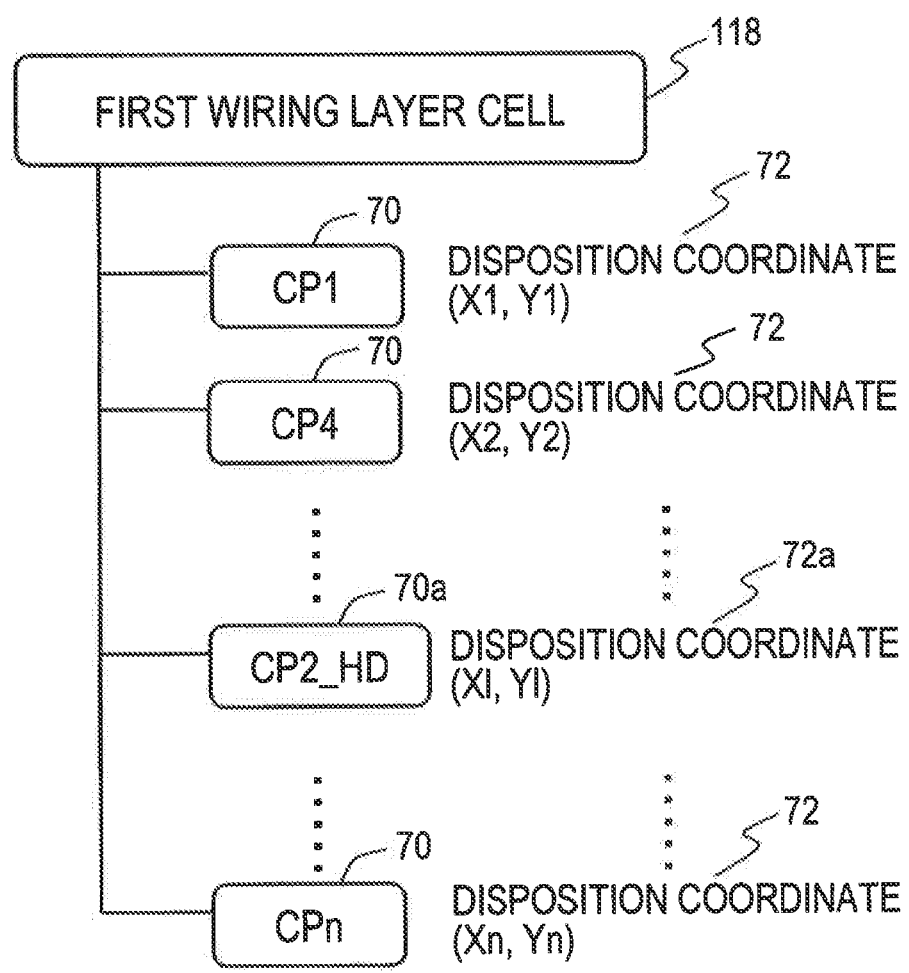
FIG. 23 illustrates an example of a wiring pattern data according to the embodiment 2.

FIG. 23 illustrates an example of a wiring pattern data 74a according to the present embodiment. Similar to the wiring pattern data 74 of the embodiment 1 (FIG. 16), the wiring pattern data 74a includes the block pattern identifiers 70 corresponding to the basic block patterns in the wiring area 38, and the layout positions 72 of the basic block patterns concerned.

The wiring pattern data 74a further includes a partial block pattern identifier 70a corresponding to the partial block pattern 86 and the layout position 72a of the partial block pattern 86.

The partial block pattern identifier 70a corresponds to the partial block pattern 86 and the cut-away block pattern having the end-side area 82 matching the partial block pattern 86. For example, a partial block pattern identifier [CP2_HD] corresponds to the partial block pattern 86 depicted in FIG. 22A and the cut-away block pattern 68a depicted in FIG. 22B.

The computer 28 searches the block pattern database 32, so as to detect the cut-away block pattern 68a having the end-side area 82 matching the partial block pattern 86. Further, the computer 28 extracts a block pattern identifier CP2 of the cut-away block pattern 68a which has been detected, and adds an attached symbol [_HD] to the tail of the block pattern identifier which has been extracted. Thus, the partial block pattern identifier is generated. The cut-away block pattern identifier corresponding to the partial block pattern identifier may easily be obtained by deleting the attached symbol [_HD] from the partial block pattern identifier.

In the electron beam exposure using the wiring data according to the present embodiment, by the irradiation of rectangular beam corresponding to the cutout frame 78 on the cut-away block pattern 68a corresponding to the partial block pattern identifier 70a, the partial block pattern 86 is transferred to the resist film 14.

At this time, the area irradiated with the rectangular beam is the end-side area 82 of the cut-away block pattern 68a. Similarly, by the irradiation of rectangular beam on the cut-away block pattern 68a, an area 84 (refer to FIG. 21) outside the cutout frame 78 is also transferred to the resist film 14.

In the example illustrated in FIGS. 20 and 21, the dangling wiring middle portion 76 to be cut away is positioned at the center of the track pattern 44. However, the position of the dangling wiring middle portion 76 is not limited to the center of the track pattern 44. For example, in case that the tolerance value of the dangling wiring length is ¼ of the track pattern length, preferably the position of the dangling wiring middle portion 76 to be cut away is any one of three positions at which the track pattern is divided into four equal parts.

As such, preferably, the position of the dangling wiring middle portion 76 to be cut away is set to a prescribed position according to the tolerance value. By limiting the position of the dangling wiring middle portion 76 to be cut away, the number of variations in the partial block pattern is reduced.

Additionally, in the above examples, the partial block pattern identifier is made correspond directly to the cut-away block pattern. However, it may also be possible to make the partial block pattern identifier correspond to the cut-away block pattern by the intermediary of, for example, a correspondence table having the partial block pattern identifier corresponding to the block pattern identifier.

Embodiment 3

Figure 24:
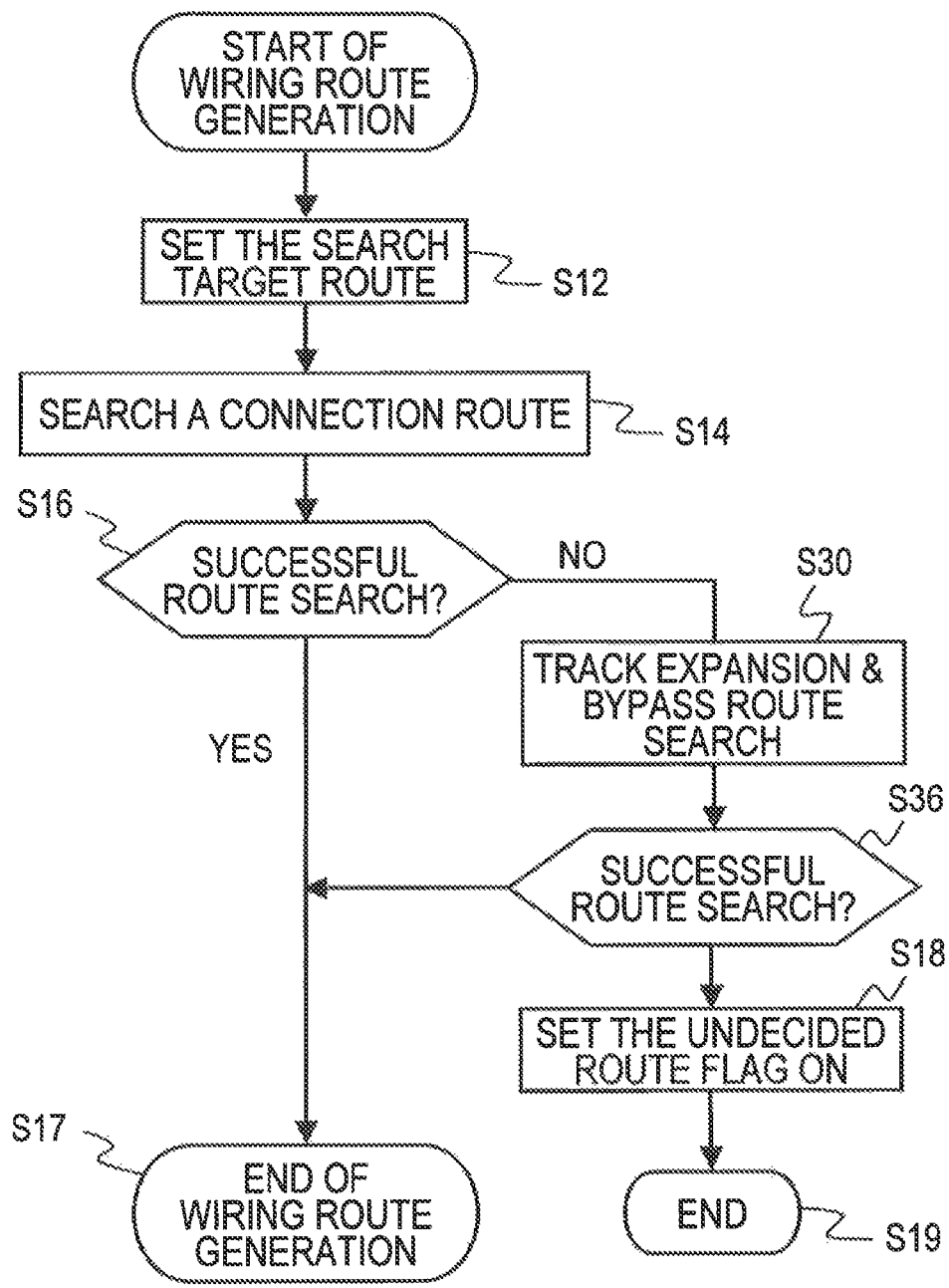
FIG. 24 is a flowchart of the wiring route generation step according to the embodiment 3.

The wiring pattern data generation method according to the present embodiment is substantially identical to the wiring pattern data generation method according to the embodiment 1 depicted in FIG. 5, except for the wiring route generation step (S4) and the track pattern terminal end cut-away step (S6). FIG. 24 is a flowchart of the wiring route generation step according to the present embodiment.

As illustrated in FIG. 24, the wiring route generation step according to the present embodiment has steps added between the "route search success/failure decision step (S16)" and the "undecided route flag ON step (S18)" in the wiring route generation step of the embodiment 1 (refer to FIG. 9). The explanation of portions common to the embodiment 1 will be omitted hereafter. As illustrated in FIG. 24, the added steps are a "track expansion & bypass route search step (S30)" and a "route search success/failure decision step (S36).

—Track Expansion & Bypass Route Search Step (S30)—

Figure 25:
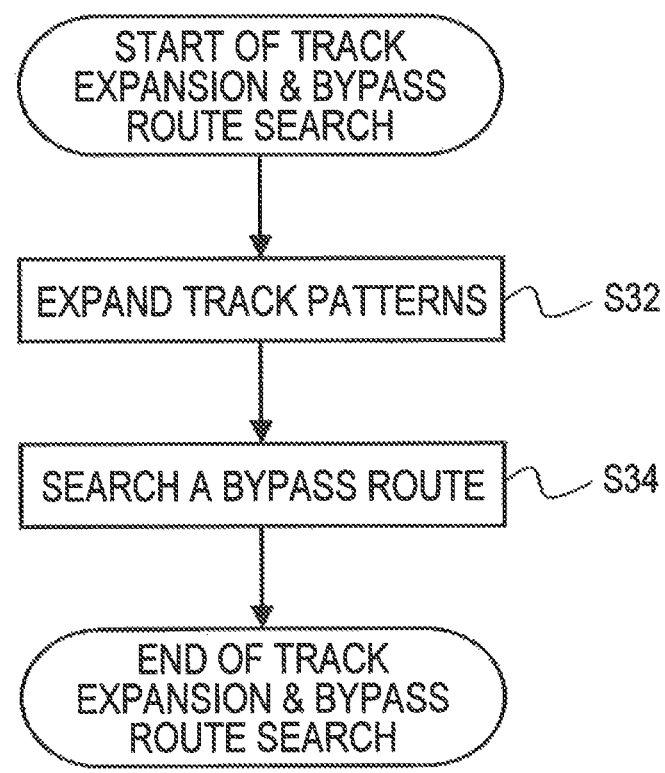
FIG. 25 is a flowchart illustrating the track expansion & bypass route search step.
Figure 26:
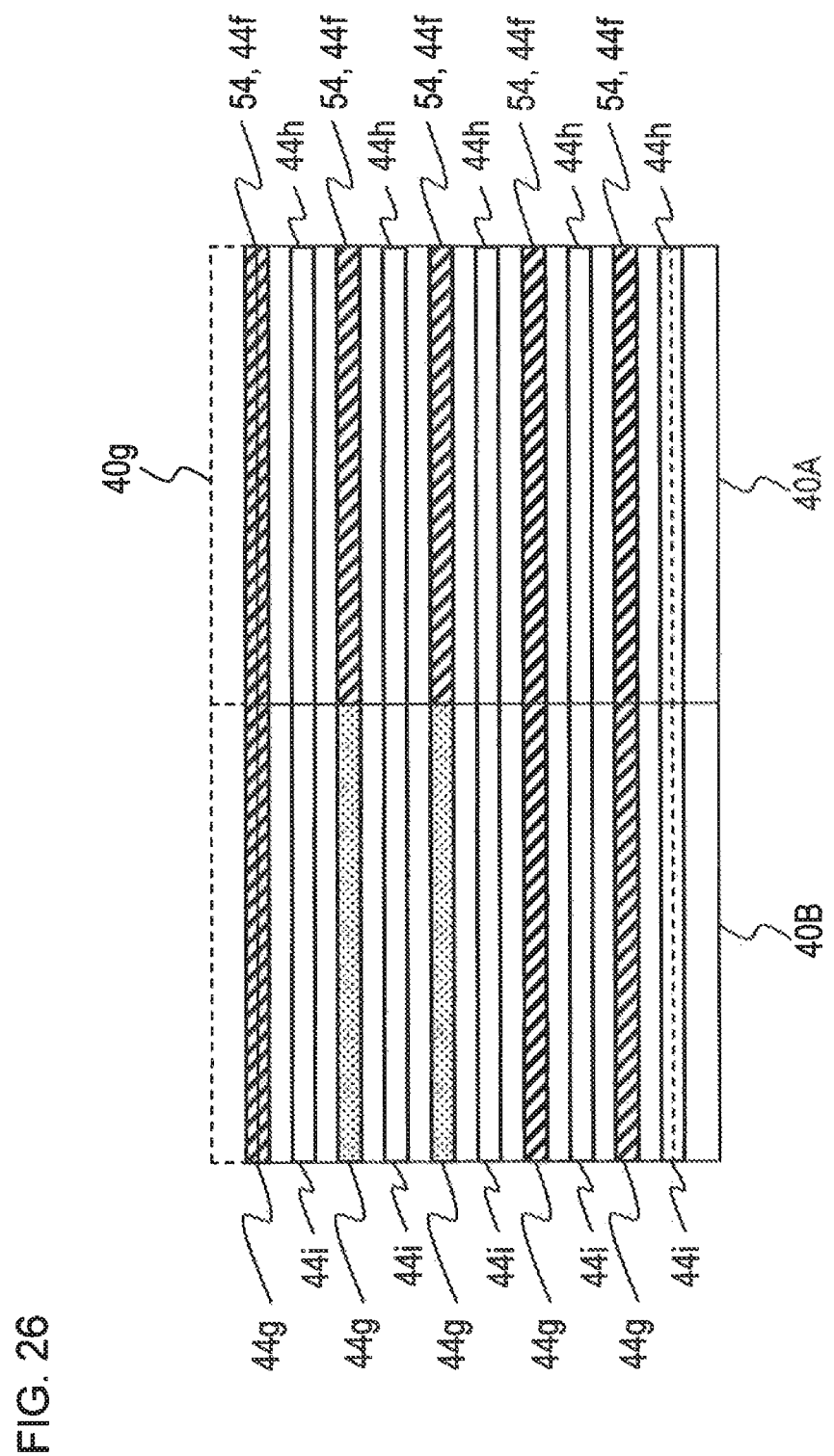
FIG. 26 is a pattern diagram explaining the track expansion & bypass route search step.

FIG. 25 is a flowchart illustrating the track expansion & bypass route search step (S30). FIGS. 26 and 27 are pattern diagrams explaining the track expansion & bypass route search step (S30).

The failure of the connection route search (S14) tends to occur in a basic block pattern in which track patterns are used in the wiring route generated beforehand. In such a case, as illustrated in FIG. 26 for example, the computer 28 disposes a basic block pattern 40A with the deviation of a half pitch (=P/2) relative to a basic block pattern 40g in which all of the track patterns are used.

Namely, the computer 28 sets the pitch of track patterns 44f (hereafter referred to as route track patterns), on which the wiring route 54 runs, to be two-fold or greater the minimum pitch allowed in designing, and disposes the basic block pattern 40A in such a manner that each track pattern (hereafter referred to as first expanded track pattern) 44h lies between the track patterns 44f (S32). The pitch of the route track patterns is the pitch P of the track patterns 44. The basic block pattern 40A is a basic block pattern in which no track pattern terminal end is cut away.

Additionally, as the pitch P of the track patterns 44f is larger, the wiring density becomes smaller, which results in a deteriorated degree of integration of the integrated circuit. Therefore, preferably, the pitch of the track patterns 44f is not larger than four-fold the minimum pitch allowed in designing.

Similarly, the computer 28 disposes a basic block pattern 40B in such a manner that each track pattern (hereafter referred to as second expanded track pattern) 44i lies between track patterns 44g connected to the route track patterns 44f (S32).

The track patterns 44g are track patterns on the side of the partially-generated connection route, for example. The second track patterns 44i are track patterns connected to the first expanded track patterns 44h. The basic block pattern 40B is a basic block pattern in which no track pattern terminal end is cut away, like the basic block pattern 40A.

Here, the number of the track patterns and each interval therebetween in the block pattern having the track patterns 44f (the basic block pattern 40g) are equal to the number of track patterns and the interval therebetween in the block pattern having the track patterns 44h, 44i (the basic block pattern 40A, 40B). Therefore, it is possible to render a layout pattern having the expanded tracks, using the basic block patterns 40 and the cut-away block patterns 68, and it is possible to save the number of block patterns mounted on the block mask to a half.

Next, as illustrated in FIG. 27, the computer 28 searches a connection route 88 (hereafter referred to as bypass route) bypassing the route track patterns 44f while running on the first track pattern 44h and the second track pattern 44i (S34). The portion of the bypass route 88 depicted with broken lines in FIG. 27 is a wiring route disposed on another wiring pattern formation plane (for example, the second wiring pattern formation plane). The route ends of the wiring routes disposed on different wiring pattern formation planes are connected by the connection via pattern.

When the route search succeeds, the bypass route 88 bypassing the route track patterns 44f is generated. When the route search fails, the bypass route 88 bypassing the route track patterns 44f is not generated.

When the connection route search is successful, the computer 28 completes the bypass route search step, as illustrated in FIG. 24 (S36→S17). When the bypass route search fails, the computer 28 sets the undecided route flag ON, and completes the wiring pattern data generation (S36→S18→S19).

—Track Pattern Terminal End Cut-Away Step—

Similar to the track pattern terminal end cut-away step (S6) explained in the embodiment 1, the computer 28 cuts away the track terminal end 64a of the track pattern, on which route end 58 of the wiring route 54 is disposed, or the track terminal end 64c of the track pattern adjacent to the track pattern (refer to FIGS. 13 and 14). Further, the computer 28 cuts away a track pattern terminal end 64d on which no bypass route 88 runs, out of the terminal ends of the first expanded track pattern 44H on which the bypass route 88 runs and the second expanded track pattern 44I connected to the first expanded track pattern 44H.

According to the present embodiment, the wiring route may be generated even on the area in which most track patterns are in use.

Embodiment 4

Figure 28A:
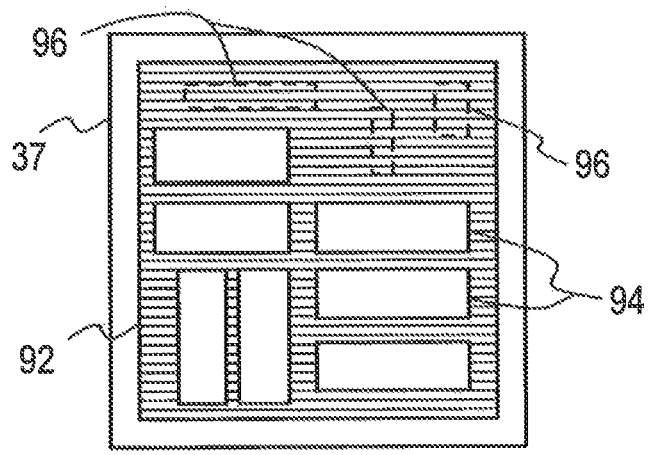
FIG. 28A is a pattern diagrams illustrating the "wiring pattern data generation method" according to the embodiment 4.
Figure 28B:
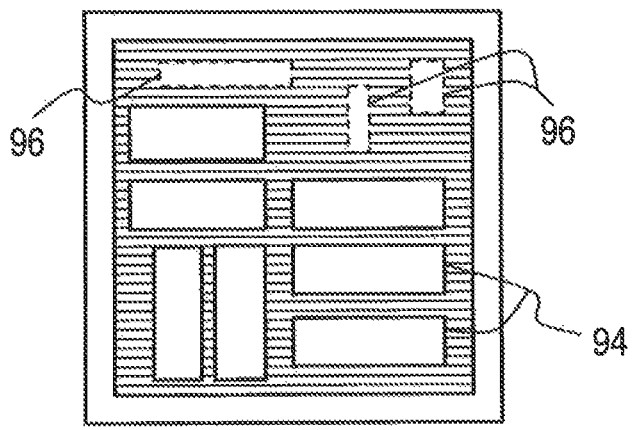
FIG. 28B is a pattern diagrams illustrating the "wiring pattern data generation method" according to the embodiment 4.
Figure 28C:
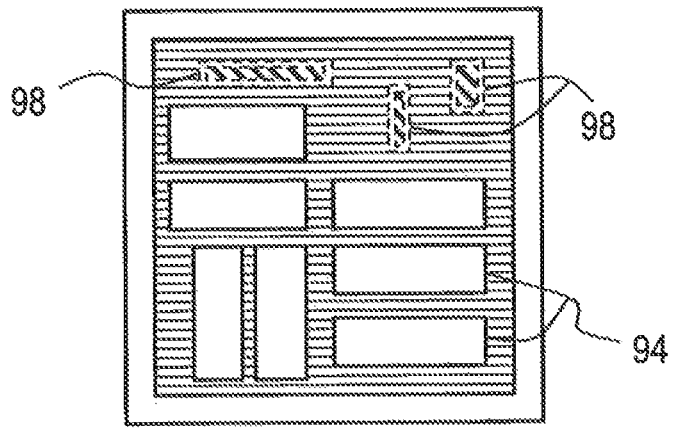
FIG. 28C is a pattern diagrams illustrating the "wiring pattern data generation method" according to the embodiment.

FIGS. 28A-28C are pattern diagrams illustrating the "wiring pattern data generation method" according to the present embodiment. According to the present embodiment, a dummy pattern layout step is provided between the connection completion decision step (S8) and the wiring pattern generation step (S10) of the embodiment 1.

FIG. 28A indicates an example of a wiring pattern 92 generated on the wiring pattern formation plane 37 by the "parallel wiring generation step (S2)" through the "connection completion decision step (S8)".

Vacant areas (hereafter referred to as memory areas) 94 depicted in FIG. 28A are areas in which memory cell patterns (not illustrated) are disposed. An area outside the wiring pattern 92 is an area in which cell patterns of peripheral circuits are disposed.

As illustrated in FIG. 28A, there are cases that vain areas 96 including no wiring route running therein are produced over a wide range of the wiring pattern formation plane 37.

The wiring patterns in the vain areas 96 are useful to prevent etching spots produced by CMP (chemical mechanical polishing). However, it is inefficient to transfer the wiring patterns in the vain areas to the resist film, using a small-sized basic block pattern.

Accordingly, in the present embodiment, a wiring pattern is generated in each vain area, using a dummy pattern having a larger size than the basic block pattern 40.

As illustrated in FIG. 28B, first, the computer 28 deletes the track patterns in the vain area 96 which is larger than the basic block pattern 40 and includes no wiring route running therein.

Thereafter, as illustrated in FIG. 28C, the computer 28 disposes in the vain area a dummy pattern 98 larger than the basic block pattern 40. At this time, it is preferable not to generate a vacant area in the vain area to the possible extent.

In the "wiring pattern data generation step (S10)", the computer 28 generates the wiring pattern data, similar to the embodiment 1, and further, generates a wiring data having the block pattern identifier of the dummy pattern 98 and the layout position of the dummy pattern 98.

Figure 29A:
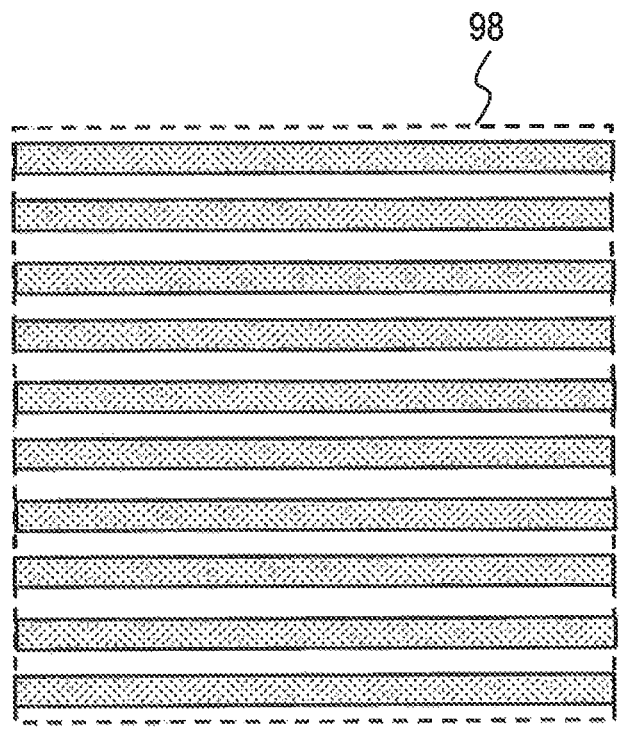
FIG. 29A is a pattern diagram explaining the dummy pattern.
Figure 29B:
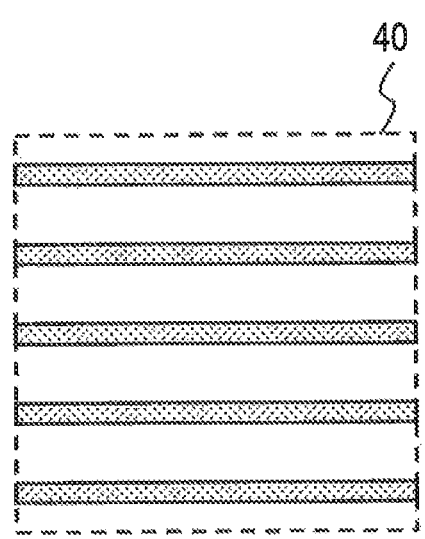
FIG. 29B is a pattern diagram explaining the dummy pattern.

FIGS. 29A and 29B are pattern diagrams explaining the dummy pattern 98.

FIG. 29A illustrates the dummy pattern 98. FIG. 29B illustrates the basic block pattern 40. As illustrated in FIG. 29A, the dummy pattern 98 is constituted by 1:1 line-and-space patterns (namely, a plurality of parallel wiring patterns), as an example.

One side of the basic block pattern 40 is, for example, 1 μm. On the other hand, one side of the dummy pattern 98 is, for example, 1.5 μm. In this case, the area of the dummy pattern 98 (=1.5 μm×1.5 μm) is larger than two-fold the area of the basic block pattern 40 (=1 μm×1 μm). Therefore, if the dummy pattern 98 is disposed in the vain area 96, the number of exposure times in the electron beam exposure is reduced to a half or smaller.

Preferably, the size of the dummy pattern 98 is identical to the maximum size of the rectangular electron beam generated by the electron beam exposure device 2.

Additionally, the external terminal pattern of the memory cell (hereafter referred to as memory terminal pattern) is provided in the memory area 94. The parallel wiring pattern in the wiring pattern 92 and the memory terminal pattern are connected by the wiring pattern formed by the VSB method. Connection points between the wiring pattern and the parallel wiring pattern are selected as search-target terminal points 56a, 56b (refer to FIGS. 10 and 11).

Figure 30:
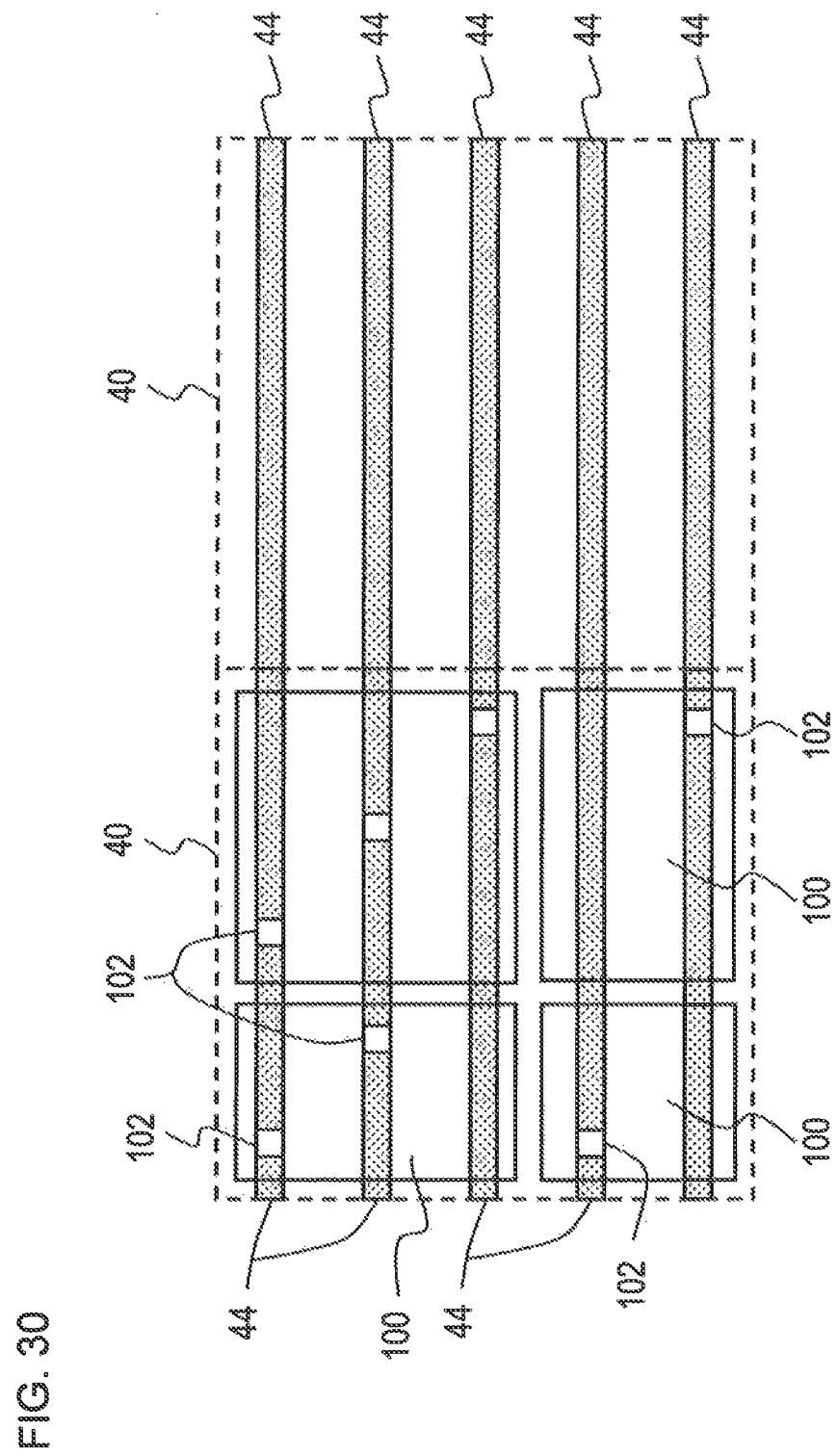
FIG. 30 is a diagram illustrating relationship between the external terminal patterns of a logic gate and the track patterns.

FIG. 30 is a diagram illustrating relationship between the external terminal patterns of a logic gate and the track patterns. In FIG. 30, cell patterns 100 of the logic gate (hereafter referred to as gate patterns) and the basic block pattern 40 are depicted.

Each gate pattern 100 is disposed on a cell pattern layout plane provided underneath the wiring pattern formation plane. Therefore, as illustrated in FIG. 30, the external terminal patterns (hereafter referred to as gate terminal patterns) 102 of the gate pattern 100 are connected to the track patterns 44 by the intermediary of the via patterns (not illustrated). The connection points between the via patterns and the track patterns 44 are also selected as search-target terminal points. In some cases, the gate terminal patterns 102 may be provided directly on the track patterns 44. In such a case, the gate terminal patterns 102 are selected as search-target terminal points.

Embodiment 5

As described in the embodiment 1, the wiring pattern data and the connection via data are generated in the wiring pattern data generation step (S10). However, in the description of the embodiment 1, a method for generating the connection via data has not been explained. In the present embodiment, an example of the connection via data generation method will be described in detail.

Figure 31:
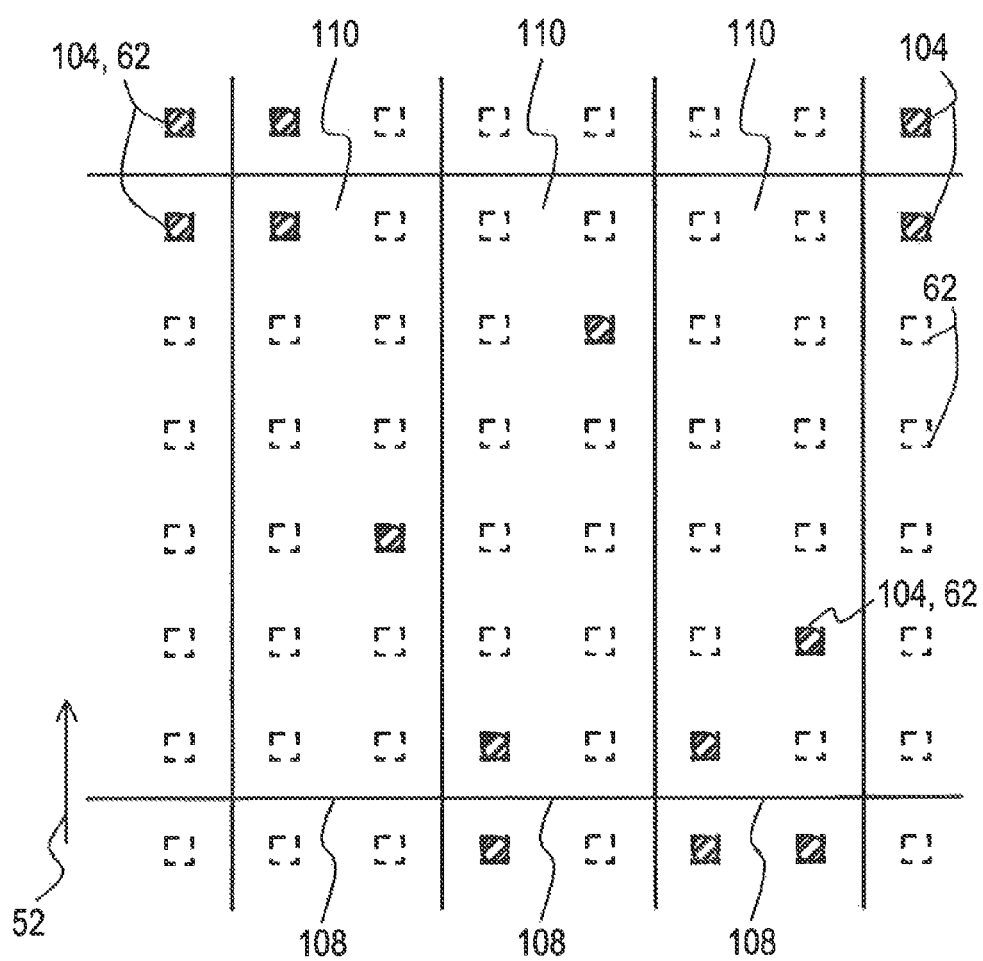
FIG. 31 is a pattern diagram illustrating the connection via data generation method.
Figure 32:
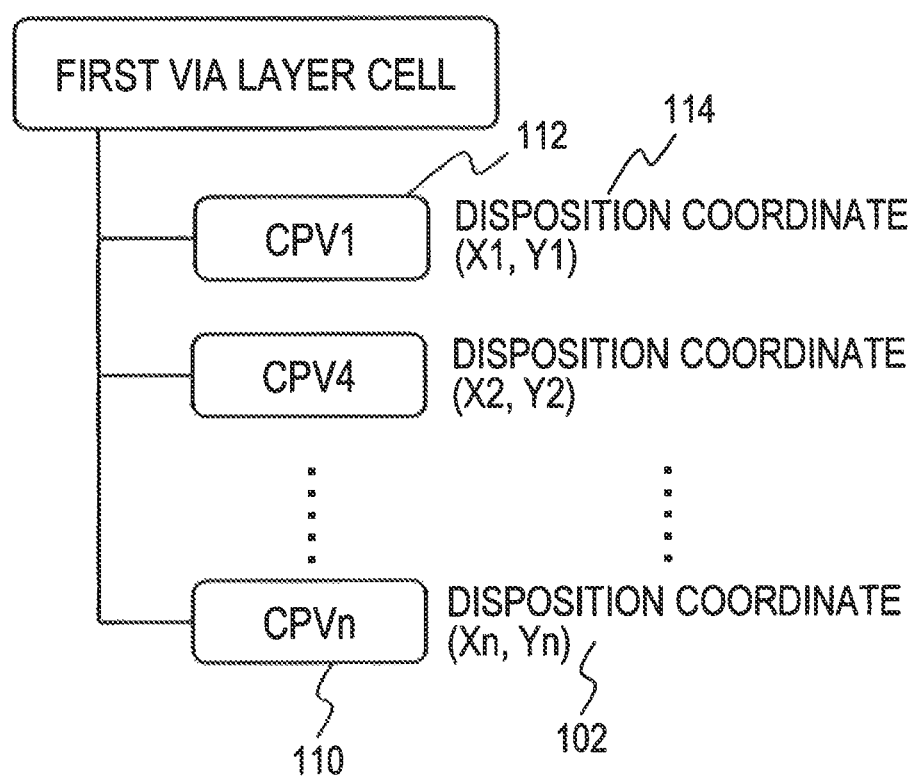
FIG. 32 is a diagram illustrating a data structure of a connection via data.

FIG. 31 is a pattern diagram illustrating the connection via data generation method. FIG. 32 is a diagram illustrating a data structure of a connection via data 116.

As described in the embodiment 1, the connection via pattern is generated if the connection route is searched across the plurality of wiring pattern formation planes. As illustrated in FIG. 31, connection via patterns 104 are disposed at the grid points 62 in the via pattern layout plane.

Thereafter, the computer 28 divides the via pattern layout plane 106 having the connection via patterns disposed on the grid points into subfields 108. As illustrated in FIG. 32, the computer 28 generates a connection via data 116, including via block pattern identifiers 112 corresponding to the patterns into which the via pattern layout plane is divided (hereafter referred to as subfield patterns) and the positions 114 of the subfield patterns 110.

In the connection via data depicted in FIG. 32, records including the via block pattern identifiers 112 and the positions 114 of the subfield patterns 110 are stored in a first via layer cell (directory). The connection via data 116 and the wiring pattern data 74 (FIG. 16) are recorded on, for example, the first HDD 28d, as a portion of the IC layout data. A cell pattern data is also recorded in the IC layout data. The cell pattern data is a data including a cell pattern identifiers and a cell pattern layout positions.

Preferably, the subfield 108 is an area smaller than the basic block pattern. For example, preferably the subfield 108 is an area that encloses approximately 2 to 4 track patterns. More specifically, it is preferable that the subfield is an area including grid points disposed on a prescribed number (for example, 1 to 6) of track patterns, which are disposed in parallel (for example, the track patterns 44b extending to the second direction 52).

The via block pattern identifier 112 is made correspond to one of a plurality of block patterns, which are different each other, generated by disposing the via pattern 104 on the grid points 62 in the subfield 110.

In the most IC layout patterns, the number of via patterns per track pattern is, at the largest, approximately one. Therefore, preferably the via block pattern has a prescribed number of via patterns or less (for example, one or less) per track pattern.

When the track pattern length is within a range of a general block pattern size (around 1.0 to 1.5 μm), one contact point per track pattern or so is sufficient for circuit connection. Therefore, by making the number of via patterns per track pattern be a prescribed number or less, it is possible to increase the subfield size, while restraining the number of variations of the via block patterns. By this, it is possible to decrease the number of rendering patterns (that is, the number of exposure times) without increasing the types of the via block patterns.

Against such the via block pattern, there are cases that the subfield pattern 110 includes a plurality of via patterns per track pattern. In such cases, the computer 28 makes the subfield pattern 110 correspond to the identifier of the via block pattern which best matches the subfield pattern. The computer 28 then generates a first connection via data including the identifier of the via block pattern and the position of the subfield pattern 110.

Next, the computer 28 makes a connection via (hereafter referred to as residual via pattern) in the subfield 110, which is not included in the best matched via block pattern, to the identifier of a single via pattern. The computer 28 generates a second connection via data including the identifier of the single via pattern and the position of the residual via pattern.

The subfield pattern is transferred to the resist film by the electron beam exposure method, based on both the first connection via data and the second connection via data.

Embodiment 6

Figure 33:
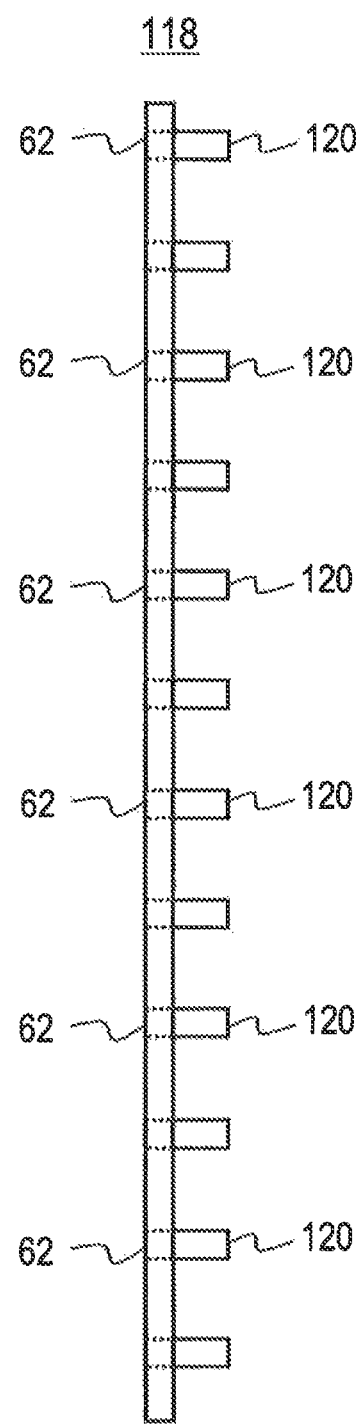
FIG. 33 is a pattern diagrams explaining the wiring pattern data generation method according to the embodiment 6.
Figure 34:
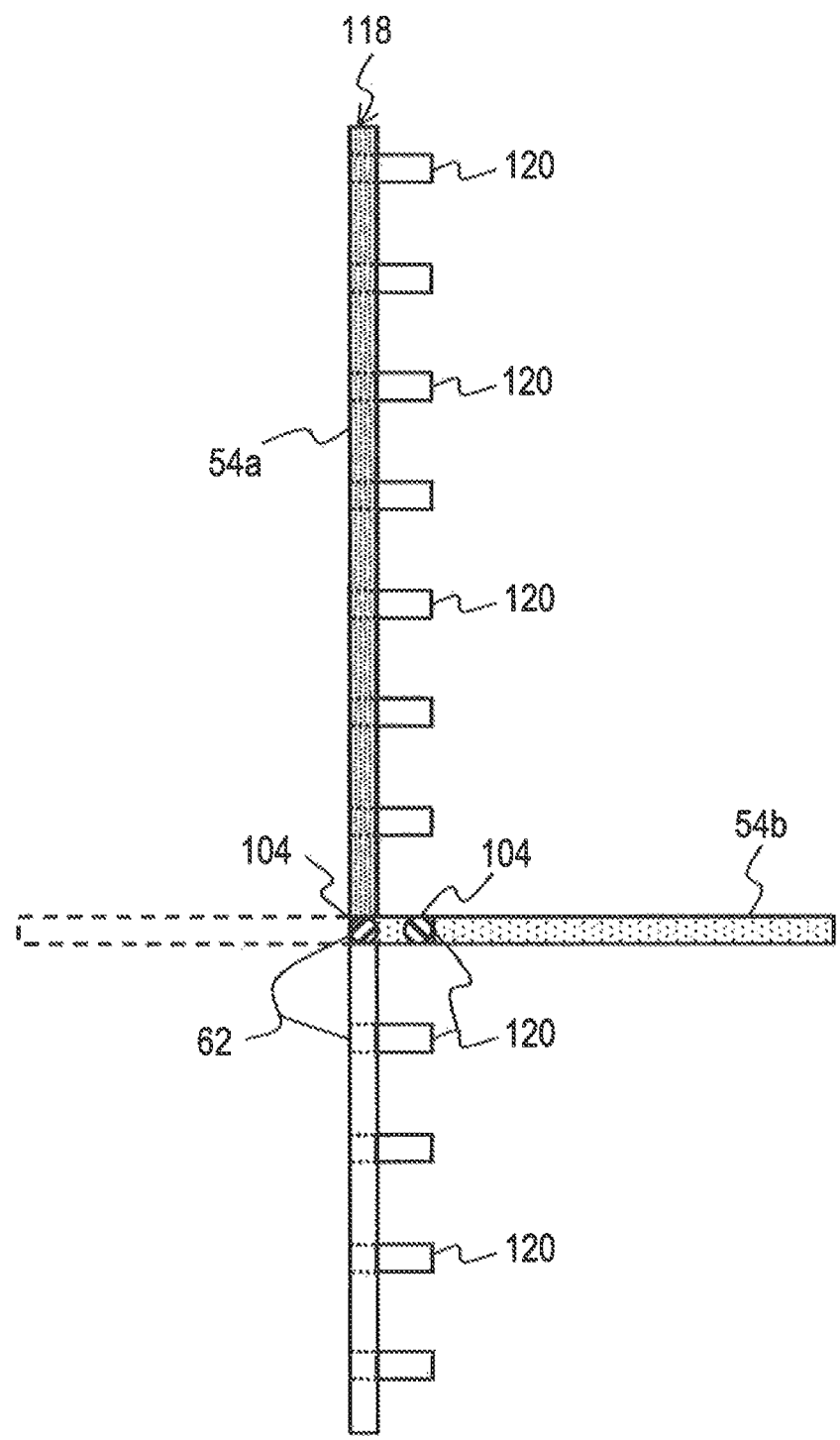
FIG. 34 is a pattern diagrams explaining the wiring pattern data generation method according to the embodiment 6.

FIGS. 33 and 34 are pattern diagrams explaining the wiring pattern data generation method according to the present embodiment. The explanation of portions common to the embodiments 1 and 5 will be omitted.

In the embodiments 1 through 5, the route end 58a of the first wiring route 54a and the route end 58b of the second wiring route 54b are connected by the single via pattern.

In contrast, in the present embodiment, the first wiring route and the second wiring route are connected via a double via pattern.

As illustrated in FIG. 33, either one track pattern 118 (for example, the second track pattern) out of the first track pattern 44a and the second track pattern 44b has protrusions 120 protruding from the grid points 62.

As illustrated in FIG. 34, by disposing the connection via patterns 104 on the grid points 62 and the protrusions 120 protruding from the grid points 62, the computer 28 connects the route end of the first wiring route 54a to the route end of the second wiring route 54b. By this, the first wiring route 54a and the second wiring route 54b are connected by the double via patterns.

Here, the basic block pattern including the track pattern 118 depicted in FIG. 33 has 12 track patterns, as is apparent from the number of grid points 64.

Now, in the embodiments 1 through 6, the computer 28 executes the wiring pattern data generation method. However, the execution of a portion of or the entire wiring data generation method explained in the embodiments 1 through 6 may be carried out manually.

The basic block pattern in the embodiments 1 through 4 includes 5 track patterns. However, the number of track patterns included in the basic block pattern is not limited to 5. The number of track patterns included in the basic block pattern may be, for example, 2 to 20, also.

In the embodiments 2 through 6, the descriptions have been given on the steps that are preferably added to the wiring data generation method of the embodiment 1. These steps may also be added to the wiring pattern data generation method of the embodiment 1, in a combined manner.

It may also be considered to generate once a physical layout pattern in which a wiring pattern may be determined randomly by the conventional EDA (electronic design automation), and a block pattern is formed on the basis of a small number of repetitiveness recognized in the layout pattern. However, if such a block pattern is used, a pattern compression effect is hardly obtained, because the repetitiveness of random wiring in a logic circuit is quite small.

To compress the number of rendering patterns in the CP electron beam exposure method, it is preferable to enlarge the block pattern size to the possible extent within a tolerable range, and to limit the number of types of the block patterns within the range of the number of blocks (around 4,000 at the largest) that may be provided in a block area.

According to the embodiments 1 through 6, the number of graphic patterns for rendering of wiring patterns may greatly be reduced, with an increased throughput in the electron beam exposure. Namely, by the embodiments 1 through 6, the graphic patterns may be reduced almost ideally because the entire wiring layout patterns are generated by the minimally needed number of block patterns, which have sizes close to the largest electron beam size capable for rendering (for example, a rectangular beam having one side of around 1.0-1.5 μm).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for generating a wiring pattern data comprising:

connecting in a wiring area a plurality of basic block patterns which include a plurality of track patterns extending to one direction and being disposed at a prescribed pitch in an intersection direction intersecting the one direction to generate a plurality of parallel wiring patterns, each of which includes the track patterns connected together;

generating a wiring route running on at least one of the track patterns in the basic block patterns connected in a manner not to dispose route ends of different wiring routes on an identical track pattern;

cutting away, using a computer, a track pattern terminal end, on which no wiring route runs, out of track pattern terminal ends of a track pattern including a route end of the wiring route, which is one of the track patterns in the connected basic block patterns, and an adjacent track pattern connected to a track pattern start end of the track pattern; and after the cutting away of a track pattern terminal end, generating a wiring is pattern data including a block pattern identifier corresponding to a basic block pattern out of the basic block patterns in the wiring area and a layout position of the basic block pattern, wherein the block pattern identifier corresponds to one of a plurality of cut-away block patterns, which are different from each other, each of which is generated from one of the basic block patterns in a state before the connecting by cutting away any of track pattern terminal ends of the track patterns included therein, or the block pattern identifier corresponds to one of the basic block patterns in the state before the connecting.

2. The method for generating a wiring pattern data according to claim 1, further comprising:

cutting away a dangling-wiring middle portion between the track pattern terminal end which is cut-away and the route end, when a dangling-wiring length between the track pattern terminal end which is cut-away and the route end exceeds a tolerance value, wherein the generating of a wiring data further includes cutting out a partial block pattern in a cutout frame, having a first end side transversal in the intersection direction across the basic block pattern in which the dangling wiring middle portion is cut away and connected to the dangling wiring middle portion from an opposite side of the wiring route and a second end side opposite to the first end side and connected to the basic block pattern, from the basic block pattern, and generating a wiring pattern data including a partial block pattern identifier corresponding to the partial block pattern and a position of the partial block pattern, and wherein the partial block pattern identifier corresponds to one of the cut-away block patterns, which includes an area matching the partial block pattern on a track pattern terminal end side.

3. The method for generating a wiring pattern data according to claim 2, wherein the dangling wiring middle portion to be cut out lies in a prescribed position depending on the tolerance value.

4. The method for generating a wiring pattern data according to claim 1, further comprising:

setting the prescribed pitch to be two-fold or greater the minimum pitch allowed in designing;

disposing one of the basic block patterns in the state before the connecting in such a manner that a first expanded track pattern lies between route track patterns, on which the wiring route runs, and a second expanded track pattern connected to the first expanded track pattern lies between track patterns connected to the route track patterns; and generating a bypass route bypassing one of the route track patterns while running on the first expanded track pattern and the second expanded track pattern, wherein, the cutting away of a track pattern terminal end further includes cutting away a track pattern terminal end on which the bypass route does not run, out of track terminal ends of the first expanded track pattern on which the bypass route runs and the second expanded track pattern connected to the first expanded track pattern.

5. The method for generating a wiring pattern data according to claim 1 further comprising:

deleting the track patterns in a vain area larger than one of the basic block patterns and not including the wiring route running therein, and disposing in the vain area a dummy pattern larger than one of the basic block patterns, wherein, the generating of a wiring pattern data further includes generating a wiring pattern data including a block pattern identifier corresponding to the dummy pattern and a layout position of the dummy pattern.

6. The method for generating a wiring pattern data according to claim 1, wherein, the connecting of a plurality of basic block patterns includes connecting in a wiring area of a first wiring pattern formation plane, a plurality of first basic block patterns which include a plurality of first track patterns extending to a first direction and being disposed at the prescribed pitch in a second direction to generate a plurality of first parallel wiring patterns, connecting in a wiring area of a second wiring pattern formation plane to be stacked above the first wiring pattern formation plane, a plurality of second basic block patterns which include a plurality of second track patterns extending to the second direction and being disposed at the prescribed pitch in a first direction to generate a plurality of second parallel wiring patterns, the generating of a wiring route further including disposing a connection via pattern on a grid point, at which one of the first track patterns intersects with one of the second track patterns, to connect a first route end disposed on one of the first track patterns to a second route end disposed on one of the second track patterns, and the generating of a wiring pattern data further includes dividing a via pattern layout plane which includes the connection via pattern disposed on the grid point into subfields, and generating a connection via data including a via block pattern identifier corresponding to each subfield pattern of the subfields and a position of the subfield pattern.

7. The method for generating a wiring pattern data according to claim 6, wherein the subfields are areas including a prescribed number of the grid point on track patterns disposed in parallel, and wherein the via block pattern identifier corresponds to one of a plurality of via block patterns, which are different from each other, each generated by disposing a via pattern on the grid point in one of the subfields.

8. The method for generating a wiring pattern data according to claim 7, wherein the plurality of via block patterns have a number of a prescribed number of via patterns or smaller, in each track pattern.

9. The method for generating a wiring pattern data according to claim 6, wherein one of the first track pattern and the second track pattern has a protrusion protruding from the grid point, and the generating of a wiring route includes disposing the connection via pattern on the grid point and the protrusion protruding from the grid point to connect the first route end and the second route end by the connection via pattern.

10. A non-transitory computer-readable storage medium with an executable program stored thereon, wherein the program instructs a central processing unit to perform the following steps:

connecting in a wiring area a plurality of basic block patterns which include a plurality of track patterns extending to one direction and being disposed at a prescribed pitch in an intersection direction intersecting the one direction to generate a plurality of parallel wiring patterns, each of which includes the track patterns connected together;

generating a wiring route running on at least one of the track patterns in the basic block patterns connected in a manner not to dispose route ends of different wiring routes on an identical track pattern;

cutting away a track pattern terminal end, on which no wiring route runs, out of track pattern terminal ends of a track pattern including a route end of the wiring route, which is one of the track patterns in the connected basic block patterns, and an adjacent track pattern connected to a track pattern start end of the track pattern; and after the cutting away of a track pattern terminal end, generating a wiring pattern data including a block pattern identifier corresponding to a basic block pattern out of the basic block patterns in the wiring area and a layout position of the basic block pattern, wherein the block pattern identifier corresponds to one of a plurality of cut-away block patterns, which are different from each other, each of which is generated from one of the basic block patterns in a state before the connecting by cutting away any of track pattern terminal ends of the track patterns included therein, or the block pattern identifier corresponds to one of the basic block patterns in the state before the connecting.

\* \* \* \* \*